(12) United States Patent
Yang

(10) Patent No.: US 11,756,641 B2
(45) Date of Patent: Sep. 12, 2023

(54) METHOD FOR DETERMINING STATUS OF A FUSE ELEMENT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/568,100

(22) Filed: Jan. 4, 2022

(65) Prior Publication Data
US 2023/0215507 A1 Jul. 6, 2023

(51) Int. Cl.
*G11C 17/18* (2006.01)
*G11C 29/02* (2006.01)
*G11C 17/16* (2006.01)
*H10B 20/20* (2023.01)

(52) U.S. Cl.
CPC .............. *G11C 17/18* (2013.01); *G11C 17/16* (2013.01); *G11C 29/027* (2013.01); *H10B 20/20* (2023.02)

(58) Field of Classification Search
CPC ..................................................... G11C 17/18
USPC ........................................................... 365/96
See application file for complete search history.

(56) References Cited

U.S. PATENT DOCUMENTS

| | | | |
|---|---|---|---|
| 6,411,556 B1 * | 6/2002 | Amano | G11C 29/785 365/230.03 |
| 6,838,926 B2 | 1/2005 | Jung et al. | |
| 10,693,460 B1 * | 6/2020 | Takahashi | G11C 11/4093 |
| 2002/0196683 A1 * | 12/2002 | Ohtani | G11C 29/72 365/200 |
| 2007/0280012 A1 * | 12/2007 | Obayashi | G11C 29/028 257/E27.071 |
| 2011/0291699 A1 * | 12/2011 | Cho | H04L 25/0278 326/30 |

FOREIGN PATENT DOCUMENTS

| | | |
|---|---|---|
| TW | 459240 B | 10/2001 |
| TW | I261263 B | 9/2006 |
| TW | I301668 B | 10/2008 |
| TW | I373061 B1 | 9/2012 |

* cited by examiner

*Primary Examiner* — Muna A Techane
(74) *Attorney, Agent, or Firm* — Muncy, Geissler, Olds & Lowe, P.C.

(57) ABSTRACT

The present disclosure provides a method for determining status of a fuse element of a memory device. The method includes providing the memory device including a first terminal and a second terminal and applying a first power signal on the first terminal of the semiconductor device. The memory device includes a configurable reference resistor unit electrically coupled to the fuse element. The method also includes obtaining an evaluation signal at the second terminal of the memory device and identifying the evaluation signal to determine whether the memory device is redundant. The configurable reference resistor unit includes a first resistor, a first transistor connected in parallel with the first resistor, and a first configurable unit connected to a gate of the first transistor. The first configurable unit is configured to generate a first configurable signal to turn on the first transistor.

10 Claims, 16 Drawing Sheets

METHOD FOR DETERMINING STATUS OF A FUSE ELEMENT

TECHNICAL FIELD

The present disclosure relates to a method for determining status of a fuse element, and more particularly, to a semiconductor circuit having a one-time programmable element and a configurable reference resistor for determining status of a fuse element in a memory device.

DISCUSSION OF THE BACKGROUND

Fuses and e-fuses are commonly used in memory elements to convert a redundant memory cell to a normal memory cell. A test circuit is utilized to determine the status of the fuse (i.e., whether the fuse is blown), such that the corresponding memory cell can be identified as a normal memory cell or a redundant memory cell. With evolving technology, the size of memory elements decreases, and the resistance of the fuse may sometimes thus fail to meet the desired value due to process variants. As a result, the status of the fuse may not be correctly identified.

In present practice, the issue of failing to meet the desired fuse resistance value can be addressed by modifying a reference resistor in the memory elements. Nevertheless, modifying a reference resistor in the memory elements invokes a restart of the entire manufacturing process with additional photomask, inevitably increasing time and cost requirements.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor circuit for determining status of a fuse element of a memory device. The semiconductor circuit includes a configurable reference resistor unit having a first terminal configured to receive a first power signal and a second terminal configured to electrically couple with the fuse element. In addition, the semiconductor circuit further includes a latch circuit for reading a first status signal of a first node between the configurable reference resistor unit and the fuse element. The configurable reference resistor unit includes a first resistor, a first transistor connected in parallel with the first resistor, and a first configurable unit connected to a gate of the first transistor. The first configurable unit is configured to generate a first configurable signal to be provided to the gate of the first transistor.

Another aspect of the present disclosure provides a semiconductor device for determining status of a fuse element of a memory device. The semiconductor device includes a configurable reference resistor unit having a first terminal configured to receive a first power signal and a second terminal configured to electrically couple with the fuse element. The configurable reference resistor unit includes a first resistor, a first transistor connected in series with the first resistor, and a first configurable unit connected to a gate of the first transistor. The first configurable unit is configured to generate a first configurable signal to be provided to the gate of the first transistor.

Another aspect of the present disclosure provides a method for determining status of a fuse element of a memory device. The method includes providing the memory device including a first terminal and a second terminal and applying a first power signal on the first terminal of the semiconductor device. The memory device includes a configurable reference resistor unit electrically coupled to the fuse element. The method also includes obtaining an evaluation signal at the second terminal of the memory device and identifying the evaluation signal to determine whether the memory device is redundant. The configurable reference resistor unit includes a first resistor, a first transistor connected in parallel with the first resistor, and a first configurable unit connected to a gate of the first transistor. The first configurable unit is configured to generate a first configurable signal to turn on the first transistor.

The configurable reference resistor unit exhibits a variable resistance. The variable resistance can be adjusted in accordance with varying resistance of the fuse element caused by the process variants. According to the actual resistance of the corresponding fuse element, the resistance of the configurable reference resistor can be modified after the device is manufactured. Therefore, the present disclosure increases flexibility. In addition, the configurable reference resistor unit is adjusted by programming the OTP element (for example, anti-fuse), which reduces impact on the adjacent area during programming The device having the flexible resistor eliminates the need for additional photomask for the reference resistor, which in turn reduces production time.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
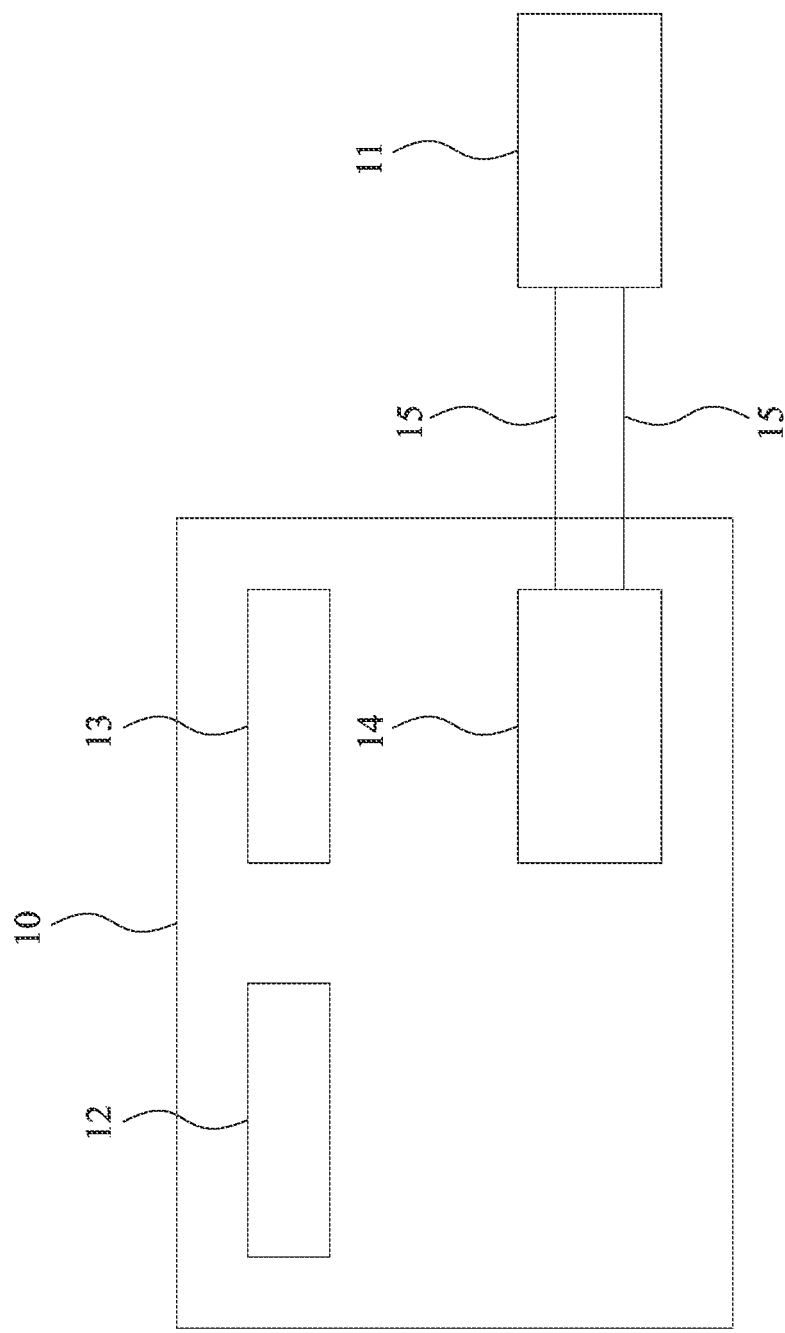
FIG. 1 is a schematic diagram of a system for testing semiconductor devices, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a diagram of a system 10 for testing a semiconductor device, in accordance with some embodiments of the present disclosure.

According to FIG. 1, the system 10 is configured to monitor a semiconductor device 11. In some embodiments, the system 10 is configured to test the semiconductor device 11. The semiconductor device may be memory, memory device, memory die, or memory chip. In some embodiments, the semiconductor device 11 may include one or more memory cells. The semiconductor device 11 can be tested after fabrication, and shipped thereafter.

In some embodiments, the system 10 can constitute testing equipment. The system 10 may include hardware and software components that provide a suitable operational and functional environment for testing. In some embodiments, the system 10 may include a signal generator 12, a monitor 13, and a coupler 14.

The signal generator 12 is configured to generate a test signal. In some embodiments, the signal generator 12 can provide a power signal. It should be understood that other electrical signals such as data signals and power signals can further be provided to the semiconductor device 11.

The monitor 13 is configured to determine a status of the semiconductor device 11. The monitor 13 can be configured to determine a status of a component of the semiconductor device 11. The response signals can be identified by the monitor 13 to determine whether a component (e.g., a memory cell) of the semiconductor device 11 is a normal device or a redundant device.

The coupler 14 is configured to couple the signal generator 12 to the semiconductor device 11. In some embodiments, the coupler 14 can be coupled to the semiconductor device 11 by one or more probes 15. The probes 15 can be part of a probe head or probe package (not shown). The probes 15 can be electrically coupled to test conductive contacts (pads) and/or bonding pads disposed on the semiconductor device 11. The test conductive pads and/or bonding pads provide electrical connections to an interconnect structure (e.g., wiring) of the semiconductor device 11. For example, some of the probes can be coupled to pads that are associated with a power supply terminal (e.g., VDD) and ground terminal (e.g., VSS) of the semiconductor device 11. Other probes can be coupled to pads associated with input/output (I/O) terminals (e.g., data signals) of the semiconductor device 11. As such, the system 10 is operable to apply electrical signals to the semiconductor device 11 and obtain response signals from the semiconductor device 11 during testing.

Figure 2:
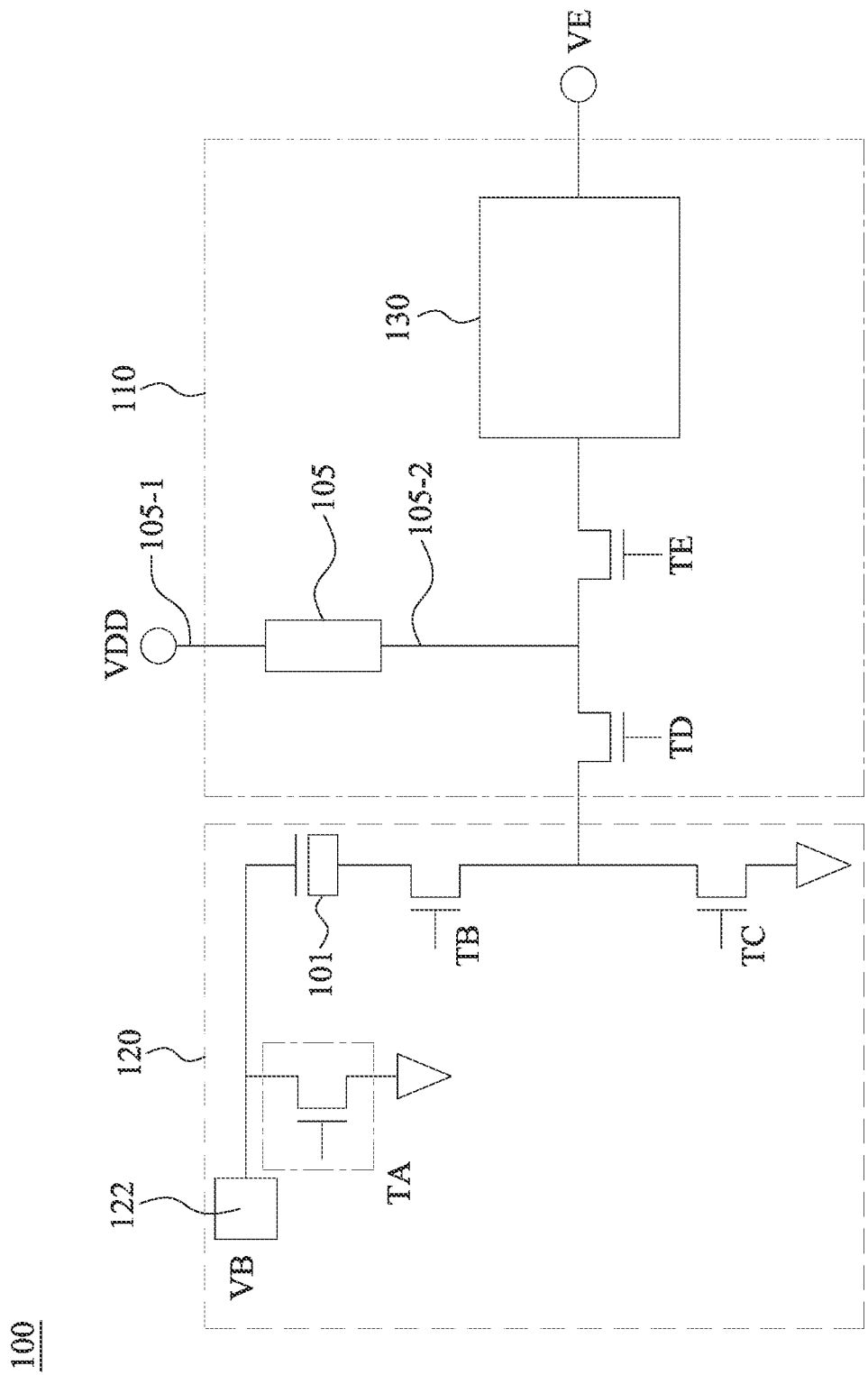
FIG. 2 is a schematic diagram of a semiconductor device, in accordance with some embodiments of the present disclosure.

FIG. 2 is a schematic diagram of a semiconductor device 100, in accordance with some embodiments of the present disclosure. The semiconductor device 100 can be memory, memory device, memory die, or memory chip. The semiconductor device 100 can be a portion of memory, memory device, memory die, or memory chip. For example, the memory can be a dynamic random access memory (DRAM). In some embodiments, the DRAM can be a double data rate four generation (DDR4) DRAM. In some embodiments, the memory includes one or more memory cells (or memory bits, memory blocks). In some embodiments, the memory cell includes a fuse element.

The semiconductor device 100 can include a fuse element 101, an evaluation unit 110, and a status-setting unit 120. In some embodiments, the evaluation unit 110 can include a configurable reference resistor unit 105, switching circuits TD and TE, and a latch circuit 130. In some embodiments, the fuse element 101 and the switching circuits TA and TB can act as a portion of the evaluation unit 110. In some embodiments, the status-setting unit 120 can include the fuse element 101, a conductive contact 122, and two switching circuits TB and TC.

Referring to FIG. 2, the configurable reference resistor unit 105 has a terminal 105-1 configured to receive a power signal VDD. The configurable reference resistor unit 105 has a terminal 105-2 configured to electrically couple with the fuse element 101. In some embodiments, the switching circuit TB can be connected to the fuse element 101. The switching circuit TD can be connected to the configurable reference resistor unit 105. In some embodiments, the switching circuit TD can be connected to the switching circuit TB. In some embodiments, the fuse element 101 can be coupled to ground through the switching circuits TB and TC. The switching circuit TA can be connected to the fuse element 101. The switching circuit TA can be connected to ground.

In some embodiments, the latch circuit 130 is coupled to the configurable reference resistor unit 105. The latch circuit 130 can be coupled to the fuse element 101 through the switching circuits TB, TD, and TE. In some embodiments, the switching circuit TE is connected to the configurable reference resistor unit 105. The switching circuit TE can be connected to the latch circuit 130. In some embodiments, the switching circuit TE can be connected to the switching circuit TD. An evaluation/output signal may be obtained at a conductive terminal VE of the latch circuit 130.

Referring to FIG. 2, the conductive contact 122 can be connected to the fuse element 101. The conductive contact 122 may be a test pad, a probe pad, a conductive pad, a conductive terminal, or other suitable element. In some embodiments, the conductive contact 122 is configured to receive a status-setting signal VB. In some embodiments, the switching circuit TB can be connected to the fuse element 101. The switching circuit TC can be connected to the switching circuit TB. The switching circuit TC can be connected to ground.

In some embodiments, the switching circuits TA, TB, TC, TD, and TE can be switches, transistors, or other switchable circuits.

Figure 2A:
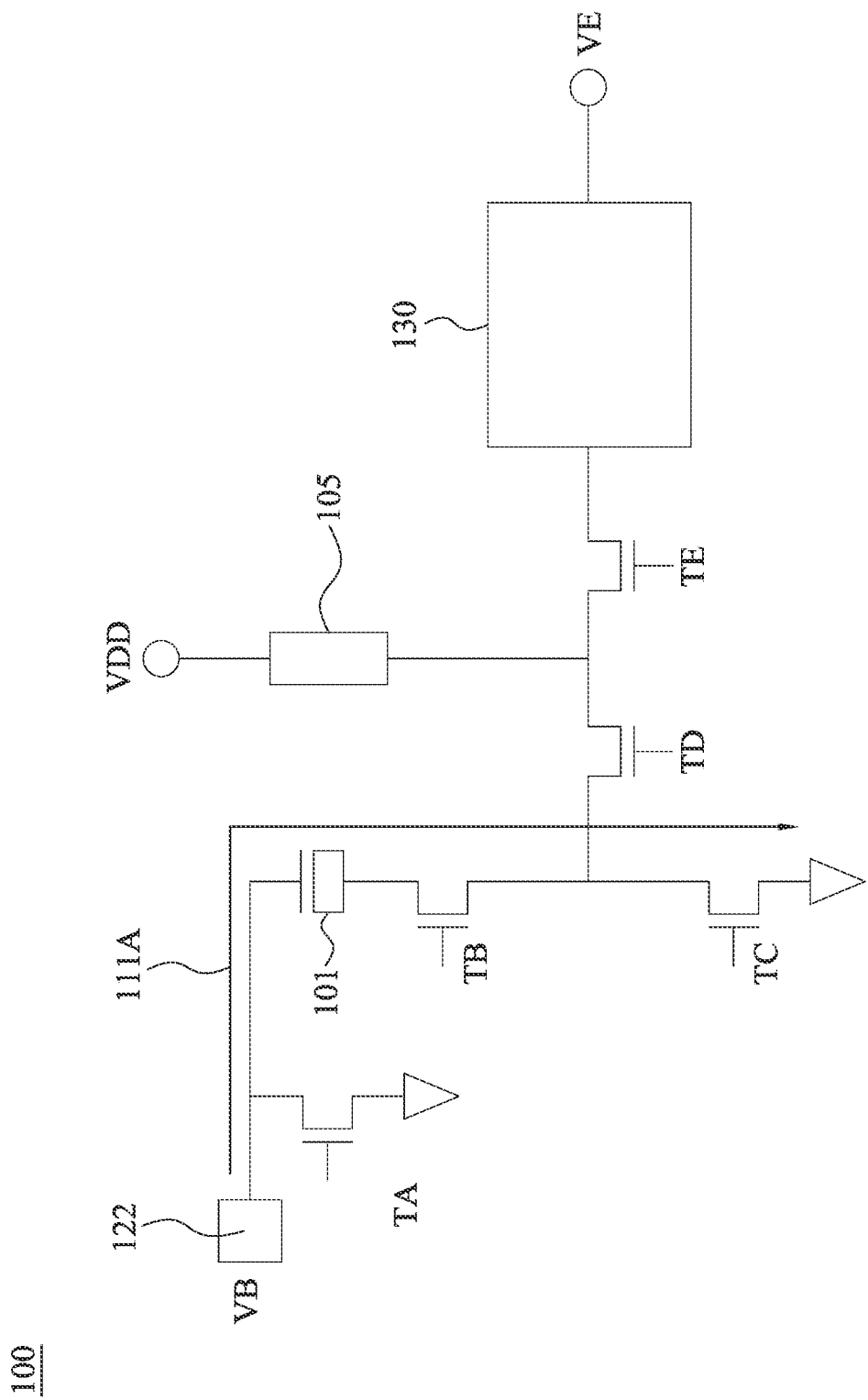
FIG. 2A is a schematic diagram of a semiconductor device, in accordance with some embodiments of the present disclosure.

FIG. 2A shows a semiconductor device 100, in accordance with some embodiments of the present disclosure. Referring to FIG. 2A, the switching circuits TB and TC are configured to be turned on to establish a conductive path 111A in response to the status-setting signal VB. In some embodiments, the conductive path 111A can pass through the fuse element 101 to ground in response to the status-setting signal VB. In some embodiments, when the status-setting signal VB is applied to the conductive terminal 122, the conductive path 111A passes through the fuse element 101, the switching circuits TB and TC, and to ground. In addition, the switching circuits TA, TD, and TE can be configured to be turned off, such that the conductive path 111A can pass through the fuse element 101.

In some embodiments, the status-setting signal VB may be a voltage signal or a current signal. In some embodiments, the status-setting signal VB may be a voltage signal having a voltage exceeding the normal operating voltage of the semiconductor device 100. For example, the status-setting signal VB can have a voltage in a range of 4 to 6V. In one embodiment, the status-setting signal VB can have a voltage in a range of 5 to 6V. When the status-setting signal VB is applied, a status of the fuse element 101 may be changed. Before the status-setting operation, the fuse element 101 may have a relatively high resistance. After the status-setting operation, the fuse element 101 may have a relatively low resistance. In the present disclosure, a fuse element before the status-setting operation can be referred to as an "unblown" fuse element, and a fuse element after the status-setting operation can be referred to as a "blown" fuse element.

The blown fuse element 101 has a resistance lower than the resistance of the unblown fuse element 101. In some embodiments, the fuse element 101 can be an anti-fuse. For example, the anti-fuse may be an e-fuse. In some embodiments, the anti-fuse includes a polysilicon e-fuse or other type of anti-fuse.

In one embodiment, the resistance of the unblown fuse element 101 can be in a range of 1.5 M$\Omega$ to 20 M$\Omega$. In another embodiment, the resistance of the unblown fuse element 101 may be in a range of 5 M$\Omega$ to 20 M$\Omega$. In some embodiments, the resistance of the unblown fuse element 101 may exceed 20 M$\Omega$. After the status-setting operation, the resistance of the blown fuse element 101 can be around 2 k$\Omega$ to 800 k$\Omega$. In one embodiment, the resistance of the blown fuse element 101 can be around 2 k$\Omega$ to 20 k$\Omega$. In another embodiment, the resistance of the blown fuse element 101 may exceed 100 k$\Omega$. In some embodiments, the resistance of the blown fuse element 101 can be around 100 k$\Omega$ to 800 k$\Omega$.

Figure 2B:
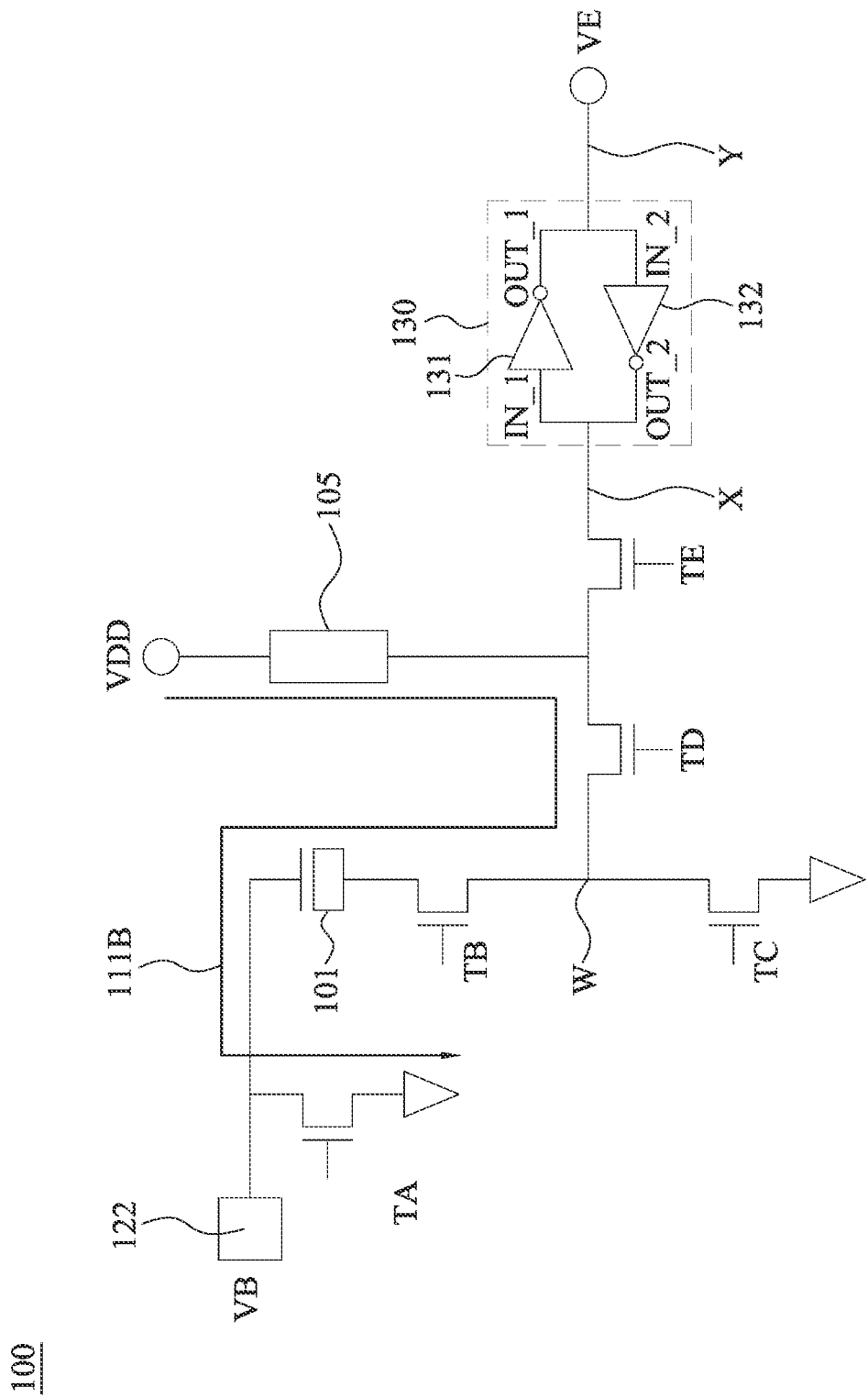
FIG. 2B is a schematic diagram of a semiconductor device, in accordance with some embodiments of the present disclosure.

FIG. 2B is a schematic diagram of a semiconductor device 100, in accordance with some embodiments of the present disclosure. Referring to FIG. 2B, the switching circuits TA, TB and TD are configured to be turned on to establish a conductive path 111B. In some embodiments, the conductive path 111B can pass through the configurable reference resistor unit 105 and the fuse element 101 to ground in response to the power signal VDD. In some embodiments, the switching circuit TC is configured to be turned off so as to establish the conductive path 111B. In some embodiments, when the power signal VDD is applied to the terminal 105-1 of the configurable reference resistor unit 105, the conductive path 111B passes through the configurable reference resistor unit 105, the switching circuits TD and TB, the fuse element 101, and the switching circuit TA, to ground. In some embodiments, the power signal VDD can be a normal operating voltage. For example, the power signal VDD can have a voltage of around 1.2V.

In some embodiments, a signal X is generated at a node W between the configurable reference resistor 105 and the fuse element 101, in response to the power signal VDD. Referring to FIG. 2B, the signal X generated at the node W can be transmitted to the latch circuit 130, through the switching circuits TD and TE.

In some embodiments, the latch circuit 130 is configured to read the signal X generated at the node W between the configurable reference resistor 105 and the fuse element 101. The node W is between the configurable reference resistor 105 and the fuse element 101 with or without other elements coupled therebetween. For example, the node W may be between the switching circuits TB and TD. In one embodiment, the node W may be between the switching circuit TD and the configurable reference resistor unit 105. In another embodiment, the node W may be between the switching circuit TB and the fuse element 101. In some embodiments, the signal X may include a voltage signal or a current signal.

In some embodiments, the switching circuit TE is configured to be turned on to transmit the signal X to the latch circuit 130. During an evaluation period, when the switching circuits TA, TB, TD, and TE are configured to be turned on to establish the conductive path 111B, the signal X can be obtained at the node W and transmit to the latch circuit 130. In some embodiments, the latch circuit 130 can read the signal X. In some embodiments, the latch circuit 130 can transform the signal X into a signal Y. For example, the transformation of the signal X operated by the latch circuit 130 may include inverting a signal into another. In one embodiment, the transformation of the signal X operated by the latch circuit 130 may include phase shifting. In another embodiment, the transformation of the signal X operated by the latch circuit 130 may include amplification.

In some embodiments, the latch circuit 130 can convert the analog signal X to a logic signal Y. The latch circuit 130 can compare the signal X with a threshold, and, based on the result of the comparison between the signal X and the threshold, output the signal Y. For example, when the signal X exceeds the threshold, the latch circuit 130 may output a logic low signal Y. On the contrary, when the signal X is lower than the threshold, the latch circuit 130 may output a logic high signal Y. In some embodiments, the signal Y has a logic value opposite to that of the signal X. For example, when the signal X is logic "0," the signal Y will be logic "1." On the contrary, when the signal X is logic "1," the signal Y will be logic "0." In some embodiments, the latch circuit 130 can store the signal Y.

Referring to FIG. 2B, the latch circuit 130 can include two inverters 131 and 132. In some embodiments, the latch circuit 130 can include more than two inverters. In some embodiments, the latch circuit 130 may be latch circuit of other type. The inverter 131 has an input terminal IN_1 and an output terminal OUT_1. The inverter 132 has an input terminal IN_2 and an output terminal OUT_2. In some embodiments, the input terminal IN_1 of the inverter 131 can be coupled to the configurable reference resistor unit 105, through the switching circuit TE. The input terminal IN_1 of the inverter 131 can be coupled to the fuse element 101, through the switching circuits TB, TD, and TE. The output terminal OUT_1 of the inverter 131 can be coupled to the conductive terminal VE. In some embodiments, the input terminal IN_1 of the inverter 131 may connect to the output terminal OUT_2 of the inverter 132. The output terminal OUT_1 of the inverter 131 may connect to the input terminal IN_2 of the inverter 132. That is, the input terminal IN_2 of the inverter 132 can be coupled to the conductive terminal VE. The output terminal OUT_2 of the inverter 132 can be coupled to the configurable reference resistor unit 105. The output terminal OUT_2 of the inverter 132 can be coupled to the fuse element 101.

To evaluate the status of the fuse element 101 (i.e., whether the fuse element 101 is blown), the signal X (or signal Y) is monitored. The signal X is compared with a predetermined signal or a threshold. Based on the comparison of the signal X and the predetermined signal, the logic signal Y can be output at the conductive terminal VE. When the signal X exceeds the predetermined signal, it indicates that the fuse element 101 is not blown. When the signal X fails to exceed the predetermined signal, it indicates that the fuse element 101 is blown.

In some embodiments, if the signal X exceeds the predetermined signal, the latch circuit 130 can output a logic low signal Y. That is, the logic low signal Y indicates that the fuse element 101 is not blown. When the signal X is lower than the predetermined signal, the latch circuit 130 may output a logic high signal Y. In other words, logic high signal Y indicates that the fuse element 101 is blown.

The signal Y may be obtained at the conductive terminal VE, such that the status of the fuse element 101 can be determined. The status of the fuse element 101 can be utilized to determine whether the semiconductor device is a redundant device or a normal device.

Figure 2C:
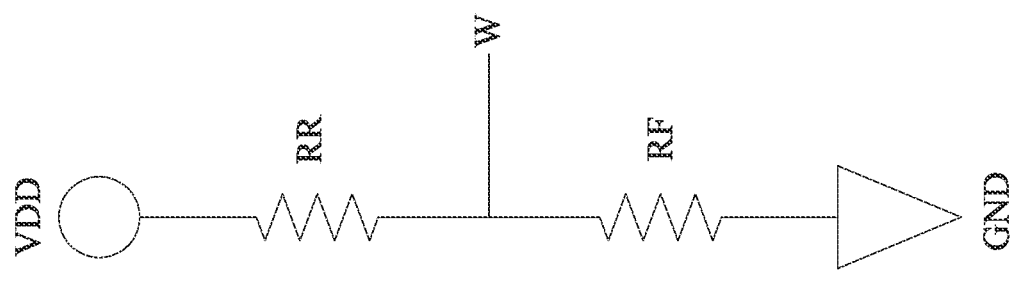
FIG. 2C illustrates an equivalent circuit of a portion of the semiconductor device shown in FIG. 2B, in accordance with some embodiments of the present disclosure.

FIG. 2C illustrates an equivalent circuit 100C of a portion of the semiconductor device 100 when the conductive path 111B is established, in accordance with the embodiments of the subject disclosure. The equivalent circuit 100C is configuration with switching circuits TA, TB and TD on and the switching circuit TC is off In other words, the equivalent circuit 100C presents a simplified circuit through which the conductive path 111B passes.

The equivalent circuit 100C includes two resistors RR and RF. In some embodiments, the resistor RR can be the resistance of the configurable reference resistor unit 105. The resistor RF can be the resistance of the fuse element 101. In some embodiments, the resistor RR can be connected to the resistor RF in series. A node W is between the resistor RR and the resistor RF. That is, the node W in FIG. 2C corresponds to the node in FIG. 2B. In some embodiments, the resistor RR is configured to receive a power signal VDD. For example, the power signal VDD may be a voltage of 1.2V. In some embodiments, the resistor RF is connected to the resistor RR and the ground.

Referring to FIG. 2C, the signal X may be a voltage signal obtained at the node W. Therefore, the signal X can be calculated according to equation 1.

$$X = \frac{RF}{RR+RF} VDD, \qquad \text{[Equation. 1]}$$

In equation 1, X represents the voltage of the signal X; RR represents the resistance of the configurable reference resistor unit 105; RF represents the resistance of the fuse element 101; and VDD represents the power signal.

To evaluate the status of the fuse element 101 accurately, the resistance RR can fall below the resistance RF of the unblown fuse element. In addition, the resistance RR can exceed the resistance RF of the blown fuse element. In some embodiments, the resistance RR may be between the resistance of the unblown fuse element and the resistance of the blown fuse element.

In one embodiment, the resistance of the unblown fuse element 101 can be in a range of 1.5 MΩ to 20 MΩ. In some embodiments, the resistance of the unblown fuse element 101 may exceed 5 MΩ. In another embodiment, the resistance of the unblown fuse element 101 may be in a range of 5 MΩ to 20 MΩ. In some embodiments, the resistance of the unblown fuse element 101 may exceed 20 MΩ. After the status-setting operation, the resistance of the blown fuse element 101 can be 2 kΩ to 800 kΩ. In some embodiments, the resistance of the blown fuse element 101 can be less than 400 kΩ. In one embodiment, the resistance of the blown fuse element 101 can be 2 kΩ to 20 kΩ. In another embodiment, the resistance of the blown fuse element 101 may exceed 100 kΩ. In some embodiments, the resistance of the blown fuse element 101 can be 100 kΩ to 800 kΩ.

In some embodiments, the resistance of the resistor RR can be variable based on the resistance of the resistor RF. In some embodiments, the configurable reference resistor unit 105 has a variable resistance RR. For example, the resistance of the resistor RR may be adjusted to exceed that of the resistor RF of the blown fuse element. The resistor RR may be adjusted to fall below the resistor RF of the unblown fuse element.

When the resistor RR is adjusted between the resistance of the unblown fuse element and the blown fuse element, the status of the fuse element 101 can be determined accurately.

In some embodiments, the predetermined signal has a voltage less than that of the power signal VDD. In some embodiments, the predetermined signal has a voltage, which fractional times the power signal VDD. For example, if the predetermined signal has a voltage half of the power signal VDD, for example of 1.2V, the predetermined signal can have a voltage of 0.6V. That is, when the result of the equation 1 exceeds 0.6V, the signal X at the node W would be considered logic high, indicating that the fuse element 101 is not blown, and when less than 0.6V, the signal X at the node W would be considered logic low, representing the fuse element 101 is blown.

As resistance of the configurable reference resistor unit 105 is variable, the flexibility of the semiconductor device is increased. The resistor RR can be adjusted according to the resistor RF following manufacture. Therefore, inaccurate determination of the status of the fuse element 101 from unstable resistance of the fuse element resulting from process variants can be avoided. With no need to restart manufacture to adjust the resistor RR, production time is reduced. Therefore, the subject disclosure provides a more flexible semiconductor device/circuit, which can reduce production time.

Figure 3:
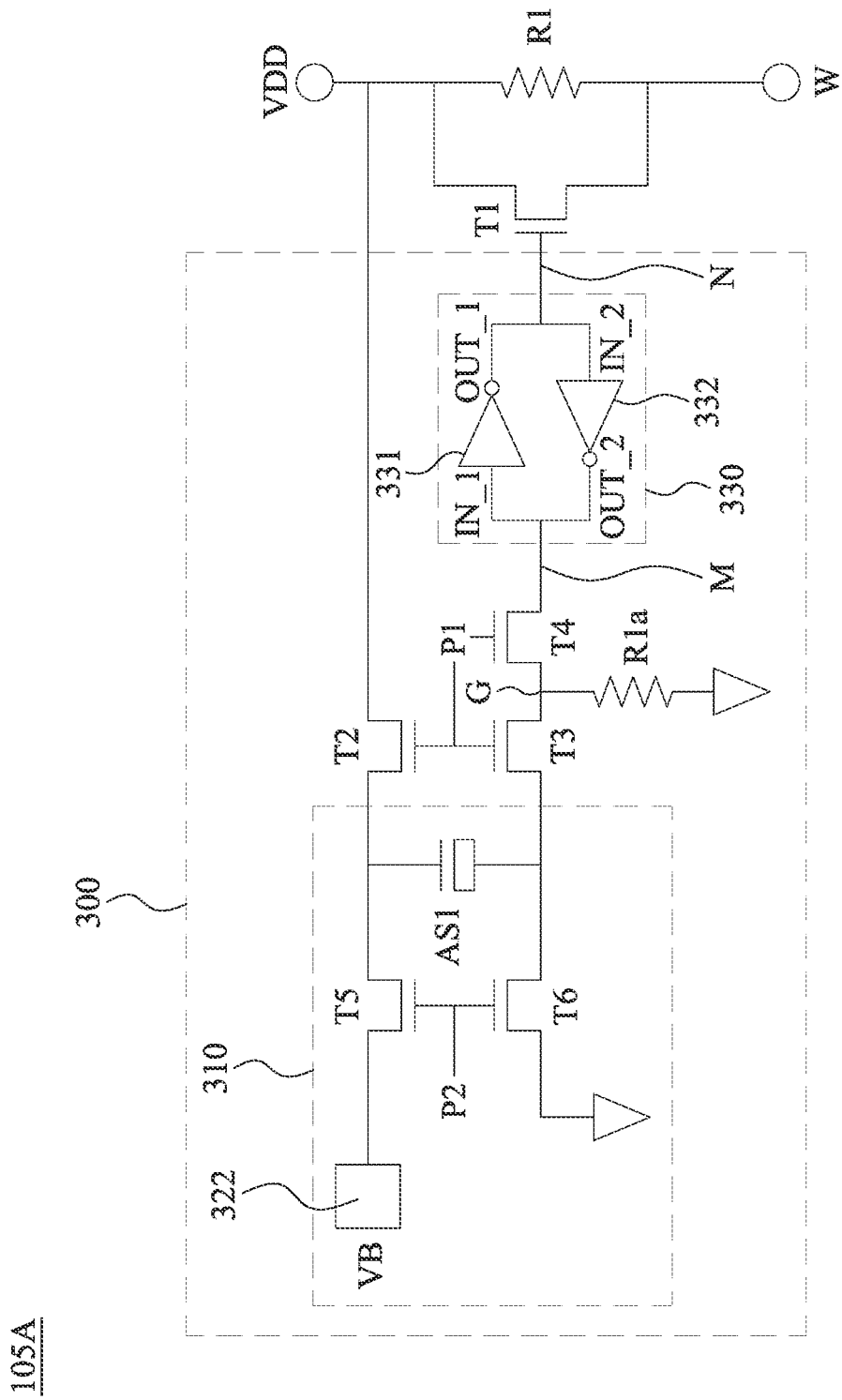
FIG. 3 is a block diagram of a configurable reference resistor unit, in accordance with some embodiments of the present disclosure.

FIG. 3 is a block diagram of a configurable reference resistor unit 105A, in accordance with some embodiments of the present disclosure. The reference resistor unit 105A can be an embodiment of the reference resistor unit 105 shown in FIGS. 2, 2A, and 2B. As shown in FIG. 3, the configurable reference resistor unit 105A may include a resistor R1, a transistor T1, and a configurable unit 300. The configurable unit 300 is configured to generate a configurable signal N to be provided to the transistor T1. In some embodiments, the configurable unit 300 may include a one-time programmable (OTP) element AS1, a resistor R1a, three transistors T2, T3 and T4, a latch circuit 330, and a programming circuit 310. The programming circuit 310 is configured to program the OTP element AS1. That is, the programming circuit 310 can be configured to change a status of the OTP element AS1. In some embodiments, the programming circuit 310 includes the OTP element AS1, transistors T5 and T6, and a conductive contact 322. In some embodiments, the latch circuit 330 can include two inverters 331 and 332.

In some embodiments, the resistor R1 is configured to receive the power signal VDD. The resistor R1 can be connected to the transistor T1. In some embodiments, the transistor T1 can be connected in parallel with the resistor R1. In some embodiments, the transistor T1 has a gate connected to the configurable unit 300. In some embodiments, the gate of the transistor T1 may be configured to receive the configurable signal N generated by the configurable unit 300. In response to the configurable signal N, the transistor T1 can be turned on or off.

The resistance of the resistor R1 may be at the kΩ level. In some embodiments, the resistance of the resistor R1 can be 100 kΩ, 200 kΩ, 300 kΩ, 400 kΩ, 500 kΩ, 800 kΩ, 1 MΩ, 1.5 MΩ, 2 MΩ, 3 MΩ, 4 MΩ, 5 MΩ, 6 MΩ, 7 MΩ, 8 MΩ, or even greater. The resistance of the resistor R1 can be configured according to design needs. The resistance of the configurable reference resistor unit 105A would be identical to that of the resistor R1, when the transistor T1 is turned off. When the transistor T1 is turned on, the resistance of the configurable reference resistor unit 105A would be substantially zero Ω.

As shown in FIG. 3, the configurable unit 300 includes an OTP element AS1, a resistor R1a, three transistors T2, T3 and T4, a latch circuit 330, and a programming circuit 310. The OTP element AS1 can be configured to receive the power signal VDD. The OTP element AS1 can be connected to the reference resistor R1a, for example, through the transistor T3. In some embodiments, the reference resistor R1a can be connected in series with the OTP element AS1.

The OTP element AS1 can be configured to receive the power signal VDD through the transistor T2. The transistor T2 has a gate configured to receive a control signal P1. In some embodiments, the transistor T3 is coupled between the OTP element AS1 and the reference resistor R1a. The transistor T3 has a gate configured to receive the control signal P1. In some embodiments, the OTP element AS1 can be an anti-fuse. For example, the anti-fuse may be an e-fuse. In some embodiments, the anti-fuse includes a polysilicon e-fuse, a dielectric anti-fuse, a gate-oxide anti-fuse, or other type of anti-fuse. In some embodiments, the OTP element AS1 (such as the anti-fuse) before the programming operation can be referred to as an "unblown" fuse, and the OTP element AS1 (such as the anti-fuse) after the programming operation can be referred to as a "blown" fuse. In some embodiments, the current capable of blowing the anti-fuse is generally low, compared with that of the normal fuse element. The keep-out distance of the anti-fuse can then be relatively short. Therefore, utilizing the anti-fuse may decrease device footprint.

In one embodiment, the resistance of the unprogrammed OTP element AS1 can exceed 5 MΩ. In another embodiment, the resistance of the unprogrammed OTP element AS1 may be in a range of 5 MΩ to 20 MΩ. In some embodiments, the resistance of the unprogrammed OTP element AS1 may exceed 20 MΩ. After the programming operation, the resistance of the programmed OTP element AS1 can be lower than 300 kΩ. In one embodiment, the resistance of the programmed OTP element AS1 can be around 2 kΩ to 300 kΩ. In another embodiment, the resistance of the programmed OTP element AS1 can be around 2 kΩ to 20 kΩ. In some embodiments, the resistance of the programmed OTP element AS1 can be around 100 kΩ to 300 kΩ.

In response to the control signal P1, the transistors T2 and T3 can be turned on to generate a signal M at a node G between the OTP element AS1 and the reference resistor R1a. In some embodiments, the transistors T2 and T3 can be configured to be turned on to establish a conductive path (not shown) through the OTP element AS1 and the reference resistor R1a to ground in response to the power signal VDD. In some embodiments, when the power signal VDD is applied to the OTP element AS1, the conductive path passes through the transistor T2, OTP element AS1, transistor T3, the reference resistor R1a, to ground. In some embodiments, the power signal VDD can be a normal operating voltage. For example, the power signal VDD can have a voltage of around 1.2V.

In some embodiments, the signal M is generated at a node G between the OTP element AS1 and the reference resistor R1a, in response to the power signal VDD. Referring to FIG. 3, the signal M generated at the node G can be transmitted to the latch circuit 330, through the transistor T4.

In some embodiments, the latch circuit 330 is configured to read the signal M generated at the node G between the OTP element AS1 and the reference resistor R1a. The node G is between the OTP element AS1 and the reference resistor R1a with or without other elements coupled therebetween. For example, the node G may be between the transistors T3 and T4. In one embodiment, the node G may be between the transistor T3 and the OTP element AS1. In some embodiments, the signal M may include a voltage signal or a current signal.

The transistor T4 is coupled between the reference resistor R1a and the latch circuit 330. The transistor T4 has a gate configured to receive the control signal P1. In some embodiments, the transistor T4 can be turned on to transmit the signal M to the latch circuit 330. When the transistors T2, T3, and T4 are turned on to establish the conductive path through the OTP element AS1 and reference resistor R1a, the signal M can be obtained at the node G and transmit to the latch circuit 330. In some embodiments, the latch circuit 330 can read the signal M. In some embodiments, the latch circuit 330 can transform the signal M into a configurable signal N. For example, the transformation of the signal M operated by the latch circuit 330 may include inverting a signal into another. In one embodiment, the transformation of the signal M operated by the latch circuit 330 may include phase shifting. In another embodiment, the transformation of the signal M operated by the latch circuit 330 may include amplification.

In some embodiments, the latch circuit 330 can convert the analog signal M into a logic signal N. The latch circuit 330 can compare the signal M with a threshold, and, based thereon, output the configurable signal N. For example, when the signal M exceeds the threshold, the latch circuit 330 may output a logic low signal N. On the contrary, when the signal M is lower than the threshold, the latch circuit 330 may output a logic high signal N. In some embodiments, the configurable signal N has a logic value opposite to that of the signal M. For example, when the signal M is logic "0," the configurable signal N will be logic "1." On the contrary, when the signal M is logic "1," the configurable signal N will be logic "0." In some embodiments, the latch circuit 330 can store the configurable signal N.

Referring to FIG. 3, the latch circuit 330 can include two inverters 331 and 332. In some embodiments, the latch circuit 330 can include more than two inverters. In some embodiments, the latch circuit 330 may be a latch circuit of other type. The inverter 331 has an input terminal IN_1 and an output terminal OUT_1. The inverter 332 has an input terminal IN_2 and an output terminal OUT_2. In some embodiments, the input terminal IN_1 of the inverter 331 can be coupled to the reference resistor R1a, through the transistor T4. The input terminal IN_1 of the inverter 331 can be coupled to the OTP element AS1, through the transistors T3 and T4. The output terminal OUT_1 of the inverter 331 can be coupled to the gate of the transistor T1. In some embodiments, the input terminal IN_1 of the inverter 331 may connect to the output terminal OUT_2 of the inverter 332. The output terminal OUT_1 of the inverter 331 may connect to the input terminal IN_2 of the inverter 332. That is, the input terminal IN_2 of the inverter 332 can be coupled to the gate of the transistor T1. The output terminal OUT_2 of the inverter 332 can be coupled to the reference resistor R1a. The output terminal OUT_2 of the inverter 332 can be coupled to the OTP element AS1.

The configurable signal N (or signal M) is associated with the status of the OTP element AS1 (i.e., whether the OTP element AS1 is programmed). The configurable signal N (or signal M) can be delivered to the gate of the transistor T1, such that the transistor T1 can be turned on or off. The signal M is compared with a predetermined signal or a threshold. Based on the comparison of the signal M and the predetermined signal, the logic signal N can be output to the gate of the transistor T1. When the OTP element AS1 is programmed, the signal M may exceed the predetermined signal, such that the transistor T1 can be turned off. When the OTP element AS1 is not programmed, the signal M may be lower than the predetermined signal, such that the transistor T1 can be turned on.

In some embodiments, if the signal M exceeds the predetermined signal, the latch circuit 330 can output a logic low signal N. That is, the logic low signal N, caused by the programmed OTP element AS1, can turn off the transistor T1. When the signal M is lower than the predetermined signal, the latch circuit 330 may output a logic high signal N. In other words, the logic high signal N, caused by the unprogrammed OTP element AS1, can turn on the transistor T1.

In response to the configurable signal N received at the gate of the transistor T1, the transistor T1 can be turned on or off. The status of the OTP element AS1 can be utilized to generate the configurable signal N (or the signal M).

Referring to FIG. 3, the programming circuit 310 is intended to program the OTP element AS1. In other words, the status of the OTP element AS1 can be modified by the programming circuit 310. In some embodiments, the OTP element AS1 can be coupled to the conductive contact 322 to receive a status-setting signal VB. The status-setting signal VB in FIG. 3 can be similar to the status-setting signal VB in FIG. 2. In some embodiments, the status-setting signal VB may have a voltage level capable of programming (blowing) the OTP element AS1. For example, the status-setting signal VB may have a voltage level in a range of 4 to 6V. In another embodiment, the status-setting signal VB can have a voltage level in a range of 5 to 6V. In some embodiments, the transistor T5 can be coupled between the conductive contact 322 and the OTP element AS1. The transistor T5 has a gate configured to receive a control signal P2. In some embodiments, the transistor T6 can be coupled between the OTP element AS1 and the ground. The transistor T6 has a gate configured to receive the control signal P2.

Figure 3A:
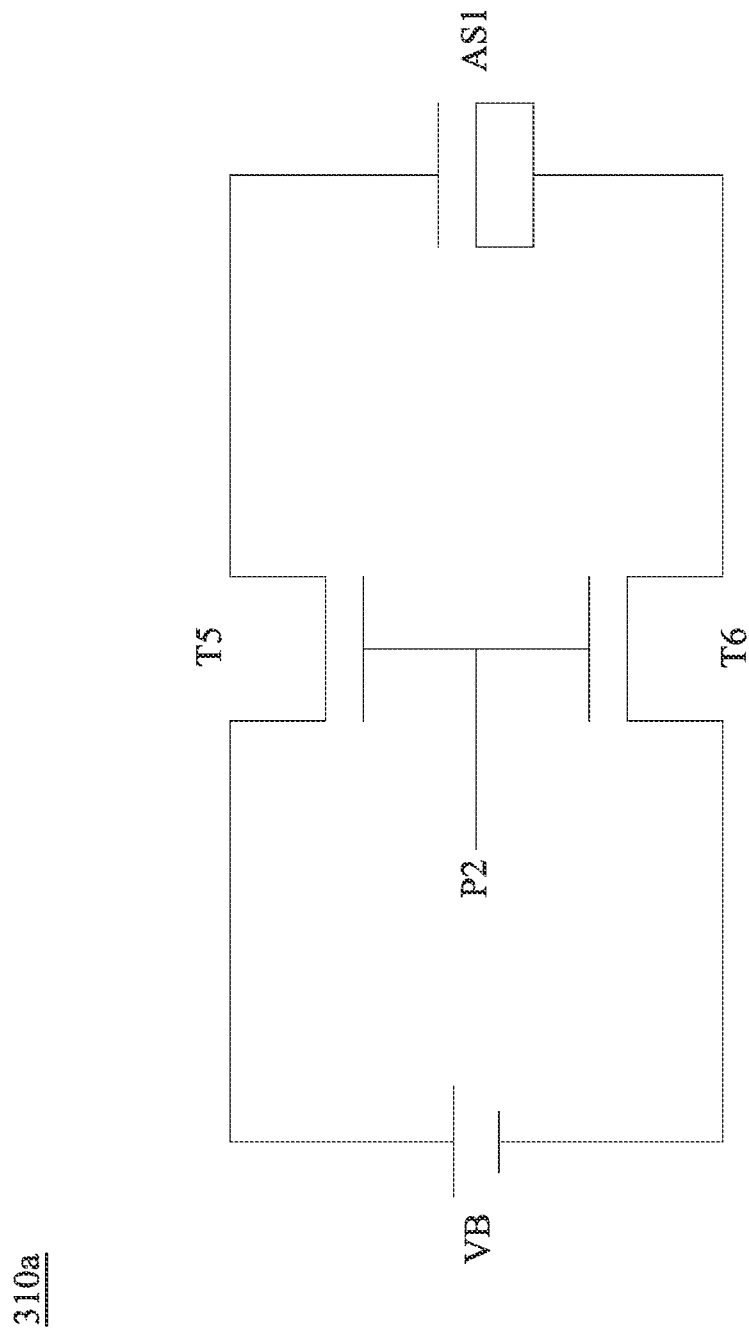
FIG. 3A is a block diagram of a status-setting circuit as shown in FIG. 3, in accordance with some embodiments of the present disclosure.

FIG. 3A is a block diagram of a programming circuit 310a, in accordance with some embodiments of the present disclosure. The programming circuit 310a in FIG. 3A is similar to the programming circuit 310 in FIG. 3, differing in that in FIG. 3A, the conductive contact 322 is replaced by a power supply for better understanding, wherein the power supply also provides the status-setting signal VB. In some embodiments, the power supply may be a voltage supply. In some embodiments, the power supply may be a current supply.

In some embodiments, in response to the control signal P2, the transistors T5 and T6 can be turned on, such that the status-setting signal VB may be applied to the OTP element AS1. With the status-setting signal VB applied to the OTP element AS1, a status of the OTP element AS1 may be changed. In some embodiments, the OTP element AS1 can be programmed by the status-setting signal VB.

Referring back to FIG. 3, the number of resistors included in the configurable reference resistor unit 105A may be increased. As more resistors are included in the configurable reference resistor unit 105A, flexibility of the variable resistance increases. In some embodiments, the number of the configurable units in the configurable reference resistor unit 105A may increase. In some embodiments, the number of configurable units may correspond to the number of resistors.

Figure 3B:
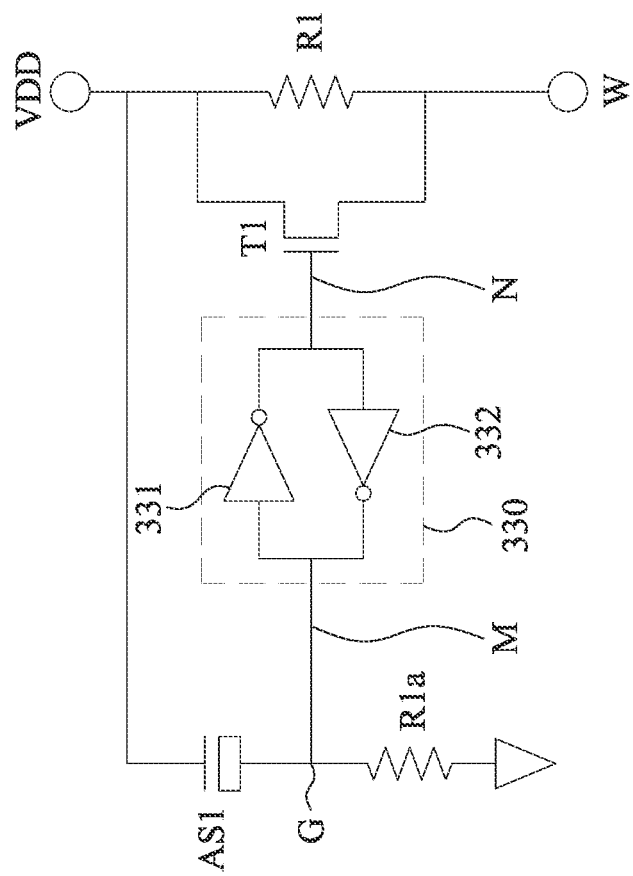
FIG. 3B illustrates an equivalent circuit of a portion of the configurable reference resistor unit shown in FIG. 3, in accordance with some embodiments of the present disclosure.

FIG. 3B illustrates an equivalent circuit 105A' of a portion of the configurable reference resistor unit 105A when the conductive path through the OTP element AS1 and the reference resistor R1a is established, in accordance with the embodiments of the subject disclosure. The equivalent circuit 105A' is configured with switching circuits T2, T3, and T4 on, and T5 and T6 off. In other words, the equivalent circuit 105A' presents a simplified circuit which generates the signal M at the node G.

The equivalent circuit 105A' includes the OTP element AS1 and the reference resistor R1a. The resistance of the OTP element AS1 may vary according to the status thereof. In some embodiments, the OTP element AS1 can be connected to the reference resistor R1a in series. The node G is between the OTP element AS1 and the reference resistor R1a. That is, the node G in FIG. 3B corresponds to the node G in FIG. 3. In some embodiments, the OTP element AS1 is configured to receive a power signal VDD. For example, the power signal VDD may have voltage of 1.2V. In some embodiments, the reference resistor R1a is connected to the OTP element AS1 and the ground.

Referring to FIG. 3B, the signal M may be a voltage signal obtained at the node G. Therefore, the signal M can be calculated according to equation 2.

$$M = \frac{R1a}{R_{AS1} + R1a} VDD, \quad \text{[Equation. 2]}$$

In equation 2, M represents the voltage of the signal M, R1a represents the resistance of the reference resistor R1a, $R_{AS1}$ represents the resistance of the OTP element AS1, and VDD represents the power signal.

In some embodiments, a result of the comparison between the signal M and a predetermined signal (threshold) can turn on the transistor T1. In one embodiment, the predetermined signal can be the predetermined signal of the latch circuit 330. In another embodiment, the predetermined signal can be the predetermined signal of the transistor T1. The predetermined signal (threshold) may have a voltage less than that of the power signal VDD. In some embodiments, the predetermined signal has a voltage, which fractional times the power signal VDD. For example, if the predetermined signal has a voltage half of the power signal VDD, for example of 1.2V, the predetermined signal can have a voltage of 0.6V. That is, when the result of the equation 2 exceeds 0.6V, the signal M at the node G would be considered logic high, such that the transistor T1 can be turned off. On the contrary, when less than 0.6V, the signal M at the node G would be considered logic low, such that the transistor T1 can be turned on.

In response to the configurable signal N generated by the configurable unit 300, the transistor T1 can be turned on, such that the resistance of the configurable reference resistor unit 105A' can be variable. Therefore, the flexibility of the semiconductor device is increased. The total resistance of the configurable reference resistor unit 105A' can be adjusted following manufacture. With no need to restart manufacture, production time can be reduced. Accordingly, the subject disclosure provides a more flexible semiconductor device/circuit, which can reduce production time.

Figure 4:
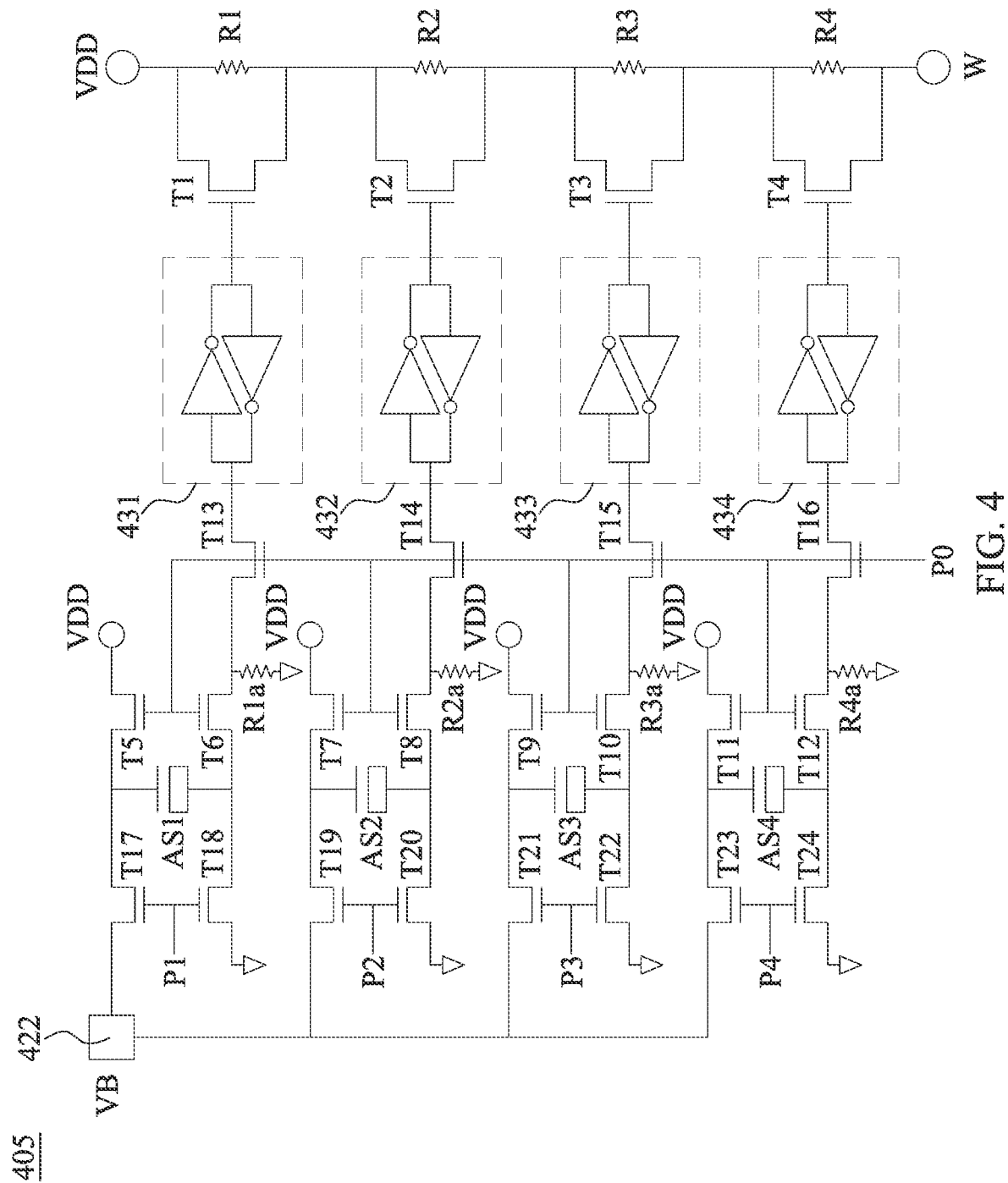
FIG. 4 is a block diagram of a configurable reference resistor unit, in accordance with some embodiments of the present disclosure.

FIG. 4 is a block diagram of a configurable reference resistor unit 405, in accordance with some embodiments of the present disclosure. The configurable reference resistor unit 405 in FIG. 4 is similar to the configurable reference resistor unit 105A in FIG. 3, differing in that in FIG. 4, the configurable reference resistor unit 405 includes more resistors and OTP elements for better flexibility.

As shown in FIG. 4, the configurable reference resistor unit 405 may include resistors R1, R2, R3, and R4, OTP elements AS1, AS2, AS3 and AS4, reference resistors R1a, R2a, R3a, and R4a, transistors T1, T2, T3, T4, T5, T6, T7, T8, T9, T10, T11, T12, T13, T14, T15, T16, T17, T18, T19, T20, T21, T22, T23, and T24, latch circuits 431, 432, 433, and 433, and a conductive contact 422.

In some embodiments, the resistor R1 is configured to receive the power signal VDD. The resistor R1 can be connected to the transistor T1. For example, the resistor R1 may be connected in parallel with the transistor T1. The resistor R1 can be connected to the resistor R2. In some embodiments, the resistor R1 can be connected in series with the resistor R2. The transistor T1 may be coupled to the resistor R2. In some embodiments, the transistor T1 may be connected in series with the transistor T2.

The resistor R2 can be connected to the transistor T2. For example, the resistor R2 may be connected in parallel with the transistor T2. The resistor R2 can be connected to the resistor R3. In some embodiments, the resistor R2 can be connected in series with the resistor R3. The transistor T2 may be coupled to the resistor R3. In some embodiments, the transistor T2 may be connected in series with the transistor T3.

The resistor R3 can be connected to the transistor T3. For example, the resistor R3 may be connected in parallel with the transistor T3. The resistor R3 can be connected to the resistor R4. In some embodiments, the resistor R3 can be connected in series with the resistor R4. The transistor T3 may be coupled to the resistor R4. In some embodiments, the transistor T3 may be connected in series with the transistor T4.

The resistor R4 can be connected to the transistor T4. For example, the resistor R4 may be connected in parallel with the transistor T4. In some embodiments, the resistor R4 can be connected to the node W. The transistor T4 may be connected to the node W.

The resistors R1, R2, R3, and R4 can have the same resistance. In some embodiments, the resistors R1, R2, R3, and R4 can have different resistances. For example, the resistance of the resistor R1 can exceed that of the resistor R2. The resistance of the resistor R1 can fall below that of the resistor R2. In some embodiments, the resistance of the resistors R1, R2, R3, and R4 can each be 100 kΩ, 200 kΩ, 300 kΩ, 400 kΩ, 500 kΩ, 800 kΩ, 1 MΩ, 1.5 MΩ, 2 MΩ, 3 MΩ, 4 MΩ, 5 MΩ, 6 MΩ, 7 MΩ, 8 MΩ, or even greater.

The resistances of the resistors R1, R2, R3, and R4 can be selected according to design needs.

Referring to FIG. 4, the configurable reference resistor unit 405 includes four configurable units (similar to the configurable unit 300 in FIG. 3) corresponding to the transistors T1, T2, T3, and T4, respectively, wherein each gate of the transistors T1, T2, T3, and T4 can receive a respective configurable signal generated by the corresponding configurable unit (not labeled in FIG. 4).

The configurable reference resistor unit 405 can include the OTP element AS1 configured to receive the power signal VDD. The OTP element AS1 can be connected to the reference resistor R1a. For example, the reference resistor R1a can be connected in series with the OTP element AS1. The OTP element AS1 can be configured to receive the power signal VDD through the transistor T5. The transistor T5 has a gate configured to receive a control signal P0. In some embodiments, the transistor T6 is coupled between the OTP element AS1 and the reference resistor R1a. The transistor T6 has a gate configured to receive the control signal P0.

As shown in FIG. 4, the latch circuit 431 is coupled to the OTP element AS1. The latch circuit 431 may be coupled to the OTP element AS1 through the transistor T13. That is, the transistor T13 can be connected between the OTP element AS1 and the latch circuit 431. The transistor T13 has a gate configured to receive the control signal P0. In some embodiments, the transistor T13 is configured to be turned on to transmit the signal, obtained between the OTP element AS1 and the reference resistor R1a, to the latch circuit 431.

In some embodiments, the latch circuit 431 can output a configurable signal to the gate of the transistor T1 based on the signal obtained between the OTP element AS1 and the reference resistor R1a. In other words, the configurable signal is associated with the status of the OTP element AS1. The OTP element AS1 is similar to the OTP element AS1 in FIG. 3, and thus detailed description thereof is omitted. In response to the configurable signal generated by the latch circuit 431, the transistor T1 can be turned on or off.

The configurable reference resistor unit 405 can include the OTP element AS2 configured to receive the power signal VDD. The OTP element AS2 can be connected to the reference resistor R2a. For example, the reference resistor R2a can be connected in series with the OTP element AS2. The OTP element AS2 can be configured to receive the power signal VDD through the transistor T7. The transistor T7 has a gate configured to receive a control signal P0. In some embodiments, the transistor T8 is coupled between the OTP element AS2 and the reference resistor R2a. The transistor T8 has a gate configured to receive the control signal P0.

As shown in FIG. 4, the latch circuit 432 is coupled to the OTP element AS2. The latch circuit 432 may be coupled to the OTP element AS2 through the transistor T14. That is, the transistor T14 can be connected between the OTP element AS2 and the latch circuit 432. The transistor T14 has a gate configured to receive the control signal P0. In some embodiments, the transistor T14 is configured to be turned on to transmit the signal, obtained between the OTP element AS2 and the reference resistor R2a, to the latch circuit 432.

In some embodiments, the latch circuit 432 can output a configurable signal to the gate of the transistor T2 based on the signal obtained between the OTP element AS2 and the reference resistor R2a. In other words, the configurable signal is associated with the status of the OTP element AS2. The OTP element AS2 is similar to the OTP element AS1 in FIG. 3, and thus detailed description thereof is omitted. In response to the configurable signal generated by the latch circuit 432, the transistor T2 can be turned on or off.

The configurable reference resistor unit 405 can include the OTP element AS3 configured to receive the power signal VDD. The OTP element AS3 can be connected to the reference resistor R3a. For example, the reference resistor R3a can be connected in series with the OTP element AS3. The OTP element AS3 can be configured to receive the power signal VDD through the transistor T9. The transistor T9 has a gate configured to receive a control signal P0. In some embodiments, the transistor T10 is coupled between the OTP element AS3 and the reference resistor R3a. The transistor T10 has a gate configured to receive the control signal P0.

As shown in FIG. 4, the latch circuit 433 is coupled to the OTP element AS3. The latch circuit 433 may be coupled to the OTP element AS3 through the transistor T15. That is, the transistor T15 can be connected between the OTP element AS3 and the latch circuit 433. The transistor T15 has a gate configured to receive the control signal P0. In some embodiments, the transistor T15 is configured to be turned on to transmit the signal, obtained between the OTP element AS3 and the reference resistor R3a, to the latch circuit 433.

In some embodiments, the latch circuit 433 can output a configurable signal to the gate of the transistor T3 based on the signal obtained between the OTP element AS3 and the reference resistor R3a. In other words, the configurable signal is associated with the status of the OTP element AS3. The OTP element AS3 is similar to the OTP element AS1 in FIG. 3, and thus detailed description thereof is omitted. In response to the configurable signal generated by the latch circuit 433, the transistor T3 can be turned on or off.

The configurable reference resistor unit 405 can include the OTP element AS4 configured to receive the power signal VDD. The OTP element AS4 can be connected to the reference resistor R4a. For example, the reference resistor R4a can be connected in series with the OTP element AS4. The OTP element AS4 can be configured to receive the power signal VDD through the transistor T11. The transistor T11 has a gate configured to receive a control signal P0. In some embodiments, the transistor T12 is coupled between the OTP element AS4 and the reference resistor R4a. The transistor T12 has a gate configured to receive the control signal P0.

As shown in FIG. 4, the latch circuit 434 is coupled to the OTP element AS4. The latch circuit 434 may be coupled to the OTP element AS4 through the transistor T16. That is, the transistor T16 can be connected between the OTP element AS4 and the latch circuit 434. The transistor T16 has a gate configured to receive the control signal P0. In some embodiments, the transistor T16 is configured to be turned on to transmit the signal, obtained between the OTP element AS4 and the reference resistor R4a, to the latch circuit 434.

In some embodiments, the latch circuit 434 can output a configurable signal to the gate of the transistor T4 based on the signal obtained between the OTP element AS4 and the reference resistor R4a. In other words, the configurable signal is associated with the status of the OTP element AS4. The OTP element AS4 is similar to the OTP element AS1 in FIG. 3, and thus detailed description thereof is omitted. In response to the configurable signal generated by the latch circuit 434, the transistor T4 can be turned on or off.

In some embodiments, the latch circuits 431, 432, 433, and 434 are similar to the latch circuit 330 in FIG. 3, and thus detailed description thereof is omitted.

In some embodiments, in response to the control signal P0, the transistors T5, T6, T7, T8, T9, T10, T11, T12, T13, T14, T15, and T16 are configured to be turned on to generate the signal X at the node W. In some embodiments, a resistance of the configurable reference resistor unit 405 is associated with a status of each of the OTP elements AS1, AS2, AS3, and AS4. By programming one or more of the OTP elements AS1, AS2, AS3 and AS4, the total resistance of the configurable reference resistor unit 405 can be adjusted.

Referring to FIG. 4, the OTP element AS1 can be coupled to the conductive contact 422 to receive a status-setting signal VB. The status-setting signal VB in FIG. 4 can be the same as the status-setting signal VB in FIG. 3. In some embodiments, the transistor T17 can be coupled between the conductive contact 422 and the OTP element AS1. The transistor T17 has a gate configured to receive a control signal P1. In some embodiments, the transistor T18 can be coupled between the OTP element AS1 and the ground. The transistor T18 has a gate configured to receive the control signal P1. In response to the control signal P1, the transistors T17 and T18 can be turned on, such that the status-setting signal VB may be applied to the OTP element AS1. With the status-setting signal VB applied to the OTP element AS1, a status of the OTP element AS1 may be changed. In other words, the OTP element AS1 can be programmed under the status-setting signal VB.

In some embodiments, the OTP element AS2 can be coupled to the conductive contact 422 to receive a status-setting signal VB. The status-setting signal VB in FIG. 4 can be the same as the status-setting signal VB in FIG. 3. In some embodiments, the transistor T19 can be coupled between the conductive contact 422 and the OTP element AS2. The transistor T19 has a gate configured to receive a control signal P2. In some embodiments, the transistor T20 can be coupled between the OTP element AS2 and the ground. The transistor T20 has a gate configured to receive the control signal P2. In response to the control signal P2, the transistors T19 and T20 are configured to be turned on, such that the status-setting signal VB may be applied to the OTP element AS2. With the status-setting signal VB applied to the OTP element AS2, a status of the OTP element AS2 may be changed. In other words, the OTP element AS2 can be programmed under the status-setting signal VB.

In some embodiments, the OTP element AS3 can be coupled to the conductive contact 422 to receive a status-setting signal VB. The status-setting signal VB in FIG. 4 can be the same as the status-setting signal VB in FIG. 3. In some embodiments, the transistor T21 can be coupled between the conductive contact 422 and the OTP element AS3. The transistor T21 has a gate configured to receive a control signal P3. In some embodiments, the transistor T22 can be coupled between the OTP element AS3 and the ground. The transistor T22 has a gate configured to receive the control signal P3. In response to the control signal P3, the transistors T21 and T22 are configured to be turned on, such that the status-setting signal VB may be applied to the OTP element AS3. With the status-setting signal VB applied to the OTP element AS3, a status of the OTP element AS3 may be changed. In other words, the OTP element AS3 can be programmed under the status-setting signal VB.

In some embodiments, the OTP element AS4 can be coupled to the conductive contact 422 to receive a status-setting signal VB. The status-setting signal VB in FIG. 4 can be the same as the status-setting signal VB in FIG. 3. In some embodiments, the transistor T23 can be coupled between the conductive contact 422 and the OTP element AS4. The transistor T23 has a gate configured to receive a control signal P4. In some embodiments, the transistor T24 can be coupled between the OTP element AS4 and the ground. The transistor T24 has a gate configured to receive the control signal P4. In response to the control signal P4, the transistors T23 and T24 can be turned on, such that the status-setting signal VB may be applied to the OTP element AS4. With the status-setting signal VB applied to the OTP element AS4, a status of the OTP element AS4 may be changed. In other words, the OTP element AS4 can be programmed under the status-setting signal VB.

According to need, the resistance of the configurable reference resistor unit 405 can be adjusted by programming one or more of the OTP elements AS1, AS2, AS3, and AS4. In some embodiments, the configurable reference resistor unit 405 includes sixteen configurations, each providing a different overall resistance. The detail of the configurations of the configurable reference resistor unit 405 is provided in Table 1 as follows. In Table 1, columns AS1, AS2, AS3 and AS4 list the status of corresponding OTP elements, wherein "0" represents an unprogrammed status and "1" represents a programmed status. The Total Resistance column shows the overall resistance of the configurable reference resistor unit 405 under each configuration.

TABLE 1

| Configu-ration | AS1 | AS2 | AS3 | AS4 | Total Resistance |
|---|---|---|---|---|---|
| 1 | 0 | 0 | 0 | 0 | 0 |
| 2 | 1 | 0 | 0 | 0 | R1 |
| 3 | 0 | 1 | 0 | 0 | R2 |
| 4 | 0 | 0 | 1 | 0 | R3 |
| 5 | 0 | 0 | 0 | 1 | R4 |
| 6 | 1 | 1 | 0 | 0 | R1 + R2 |
| 7 | 1 | 0 | 1 | 0 | R1 + R3 |
| 8 | 1 | 0 | 0 | 1 | R1 + R4 |
| 9 | 0 | 1 | 1 | 0 | R2 + R3 |
| 10 | 0 | 1 | 0 | 1 | R2 + R4 |
| 11 | 0 | 0 | 1 | 1 | R3 + R4 |
| 12 | 1 | 1 | 1 | 0 | R1 + R2 + R3 |
| 13 | 1 | 1 | 0 | 1 | R1 + R2 + R4 |
| 14 | 1 | 0 | 1 | 1 | R1 + R3 + R4 |
| 15 | 0 | 1 | 1 | 1 | R2 + R3 + R4 |
| 16 | 1 | 1 | 1 | 1 | R1 + R2 + R3 + R4 |

In some embodiments, the resistor R1 can be 100 kΩ; the resistor R2 can be 200 kΩ; the resistor R3 can be 400 kΩ; and the resistor R4 can be 800 kΩ. Accordingly, the total resistance may be variable in a range of 0 to 1500 kΩ. Furthermore, the total resistance of each configuration in this example is provided in Table 1A as follows.

TABLE 1A

| Configu-ration | AS1 | AS2 | AS3 | AS4 | Total Resistance (kΩ) |
|---|---|---|---|---|---|
| 1 | 0 | 0 | 0 | 0 | 0 |
| 2 | 1 | 0 | 0 | 0 | 100 |
| 3 | 0 | 1 | 0 | 0 | 200 |
| 4 | 0 | 0 | 1 | 0 | 400 |
| 5 | 0 | 0 | 0 | 1 | 800 |
| 6 | 1 | 1 | 0 | 0 | 300 |
| 7 | 1 | 0 | 1 | 0 | 500 |
| 8 | 1 | 0 | 0 | 1 | 900 |
| 9 | 0 | 1 | 1 | 0 | 600 |
| 10 | 0 | 1 | 0 | 1 | 1000 |
| 11 | 0 | 0 | 1 | 1 | 1200 |
| 12 | 1 | 1 | 1 | 0 | 700 |
| 13 | 1 | 1 | 0 | 1 | 1100 |
| 14 | 1 | 0 | 1 | 1 | 1300 |
| 15 | 0 | 1 | 1 | 1 | 1400 |
| 16 | 1 | 1 | 1 | 1 | 1500 |

As shown in FIG. 4, OTP elements AS1, AS2, AS3, and AS4 are not programmed. FIG. 4 can represent Configuration 1 listed in the Table 1 and Table 1A. That is, the total resistance of the configurable reference resistor 405 can be zero Ω.

Figure 4A:
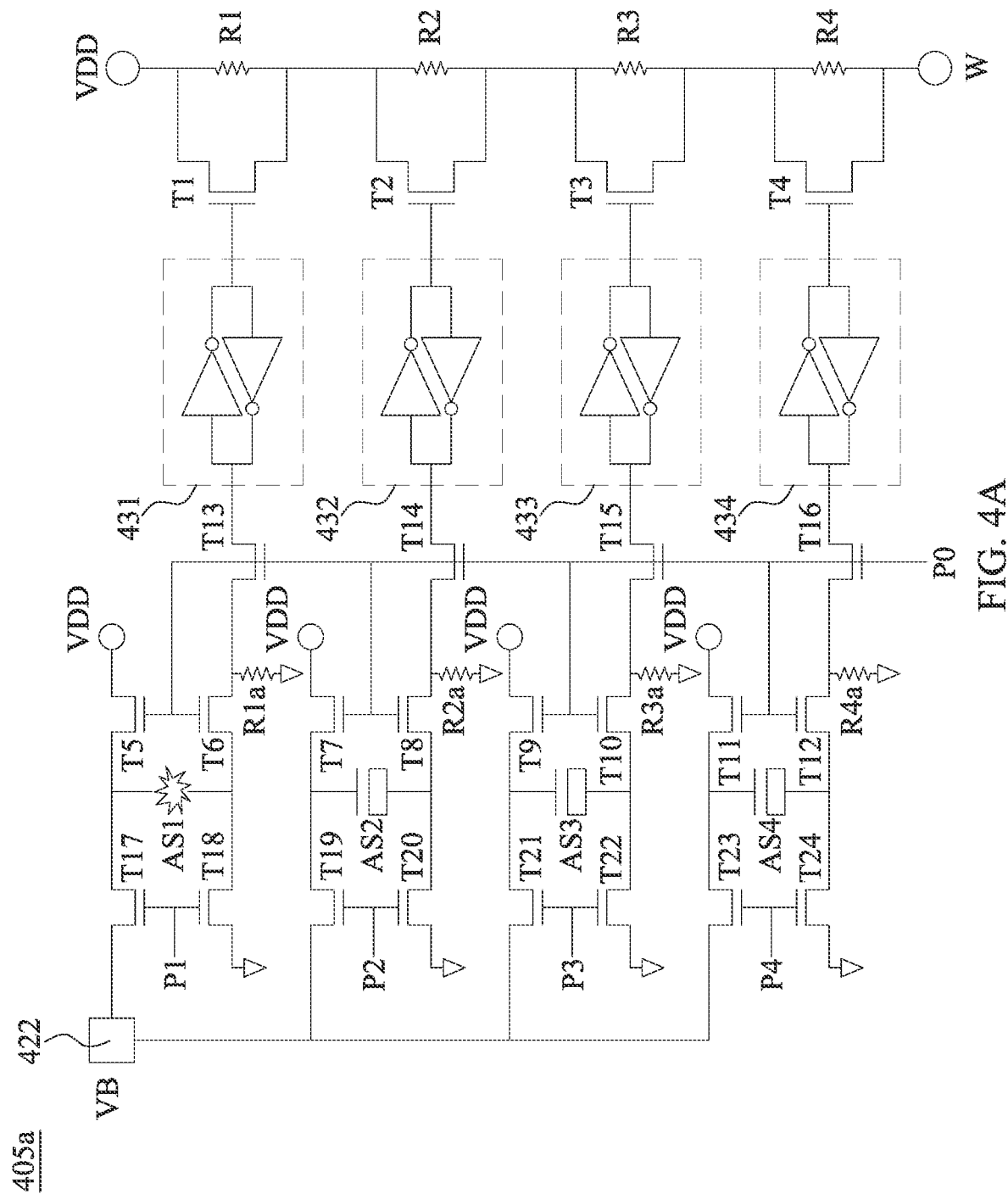
FIG. 4A illustrates an exemplary configuration of the configurable reference resistor unit, in accordance with some embodiments of the present disclosure.

FIG. 4A illustrates an exemplary configuration of the configurable reference resistor unit 405a, in accordance with some embodiments of the present disclosure. The configurable reference resistor unit 405a in FIG. 4A is similar to the configurable reference resistor unit 405 in FIG. 4, differing in that in FIG. 4A, the configurable reference resistor unit 405a includes the OTP element AS1 being programmed.

As the OTP element AS1 is programmed, FIG. 4A represents Configuration 2 listed in Table 1 and Table 1A. That is, in this embodiment, the total resistance of the configurable reference resistor 405a is identical to that of the resistor R1. According to the embodiment shown in Table 1A, the total resistance of the configurable reference resistor 405a can be 100 kΩ.

Figure 4B:
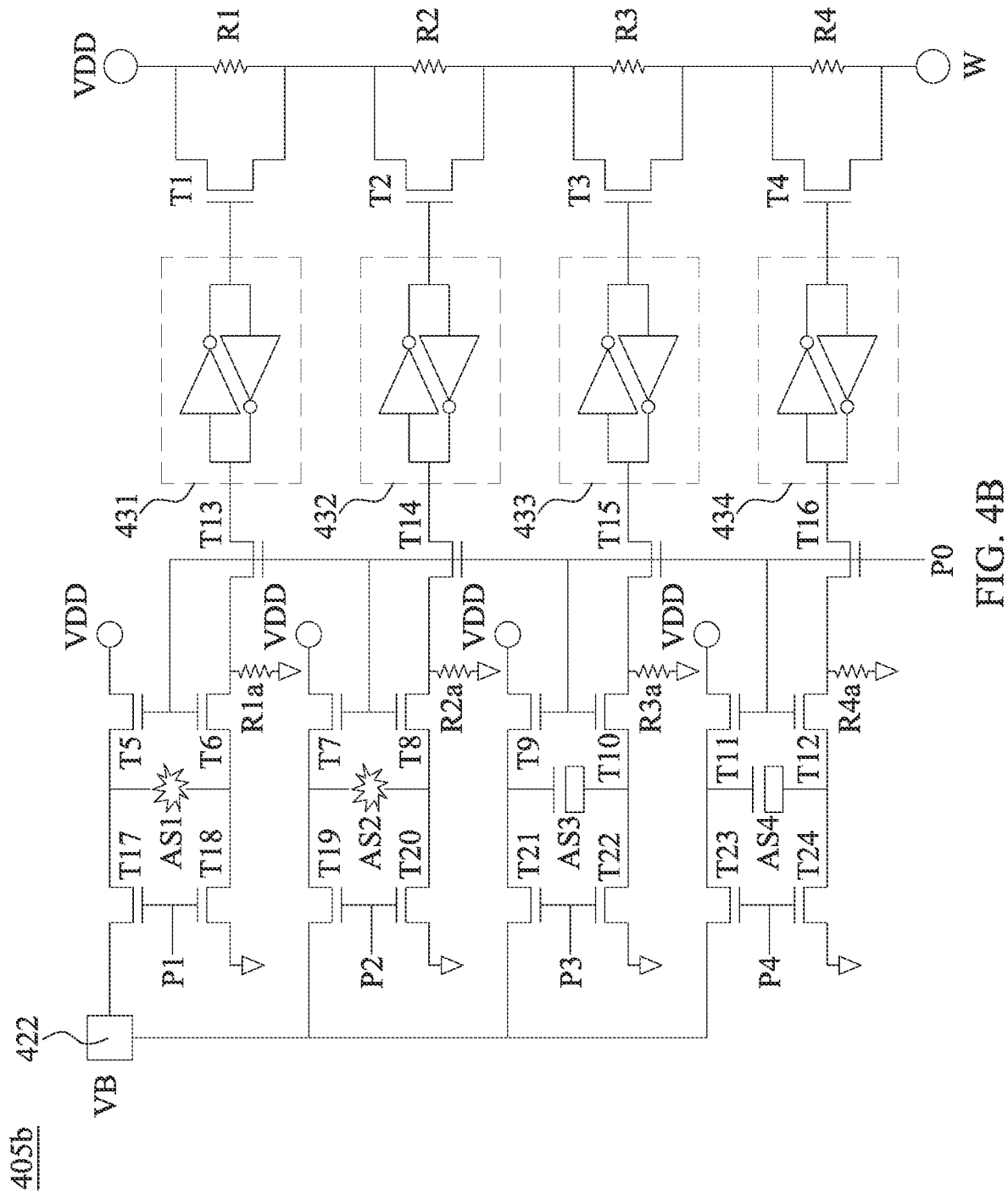
FIG. 4B illustrates an exemplary configuration of the configurable reference resistor unit, in accordance with some embodiments of the present disclosure.

FIG. 4B illustrates an exemplary configuration of the configurable reference resistor unit 405b, in accordance with some embodiments of the present disclosure. The configurable reference resistor unit 405b in FIG. 4B is similar to the configurable reference resistor unit 405 in FIG. 4, differing in that in FIG. 4B, the configurable reference resistor unit 405b includes the OTP elements AS1 and AS2 being programmed.

As the OTP elements AS1 and AS2 are programmed, FIG. 4B represents Configuration 6 listed in Table 1 and Table 1A. That is, in this embodiment, the total resistance of the configurable reference resistor 405b is a sum of resistors R1 and R2. According to the embodiment of Table 1A, the total resistance of the configurable reference resistor 405b can be 300 kΩ.

Figure 4C:
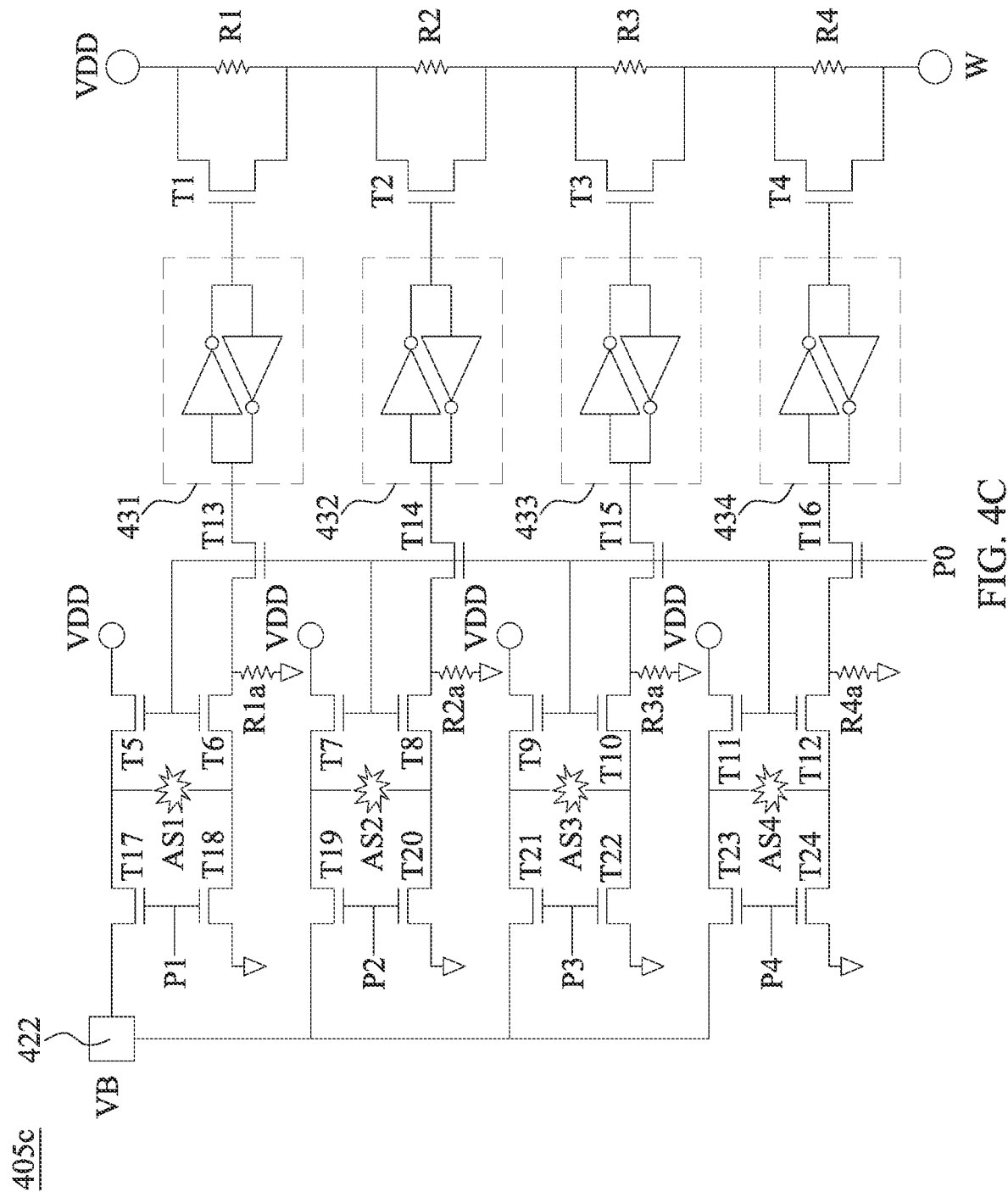
FIG. 4C illustrates an exemplary configuration of the configurable reference resistor unit, in accordance with some embodiments of the present disclosure.

FIG. 4C illustrates an exemplary configuration of the configurable reference resistor unit 405c, in accordance with some embodiments of the present disclosure. The configurable reference resistor unit 405c in FIG. 4C is similar to the configurable reference resistor unit 405 in FIG. 4, differing in that in FIG. 4C, the configurable reference resistor unit 405c includes the OTP elements AS1, AS2, AS3, and AS4 being programmed. In other words, all OTP elements are programmed in the configurable reference resistor unit 405c.

As the OTP elements AS1, AS2, AS3, and AS4 are programmed, FIG. 4C represents Configuration 16 listed in Table 1 and Table 1A. That is, in this embodiment, the total resistance of the configurable reference resistor 405c is the sum of resistors R1, R2, R3, and R4. According to the embodiment of Table 1A, the total resistance of the configurable reference resistor 405c can be 1500 kΩ.

Figure 5:
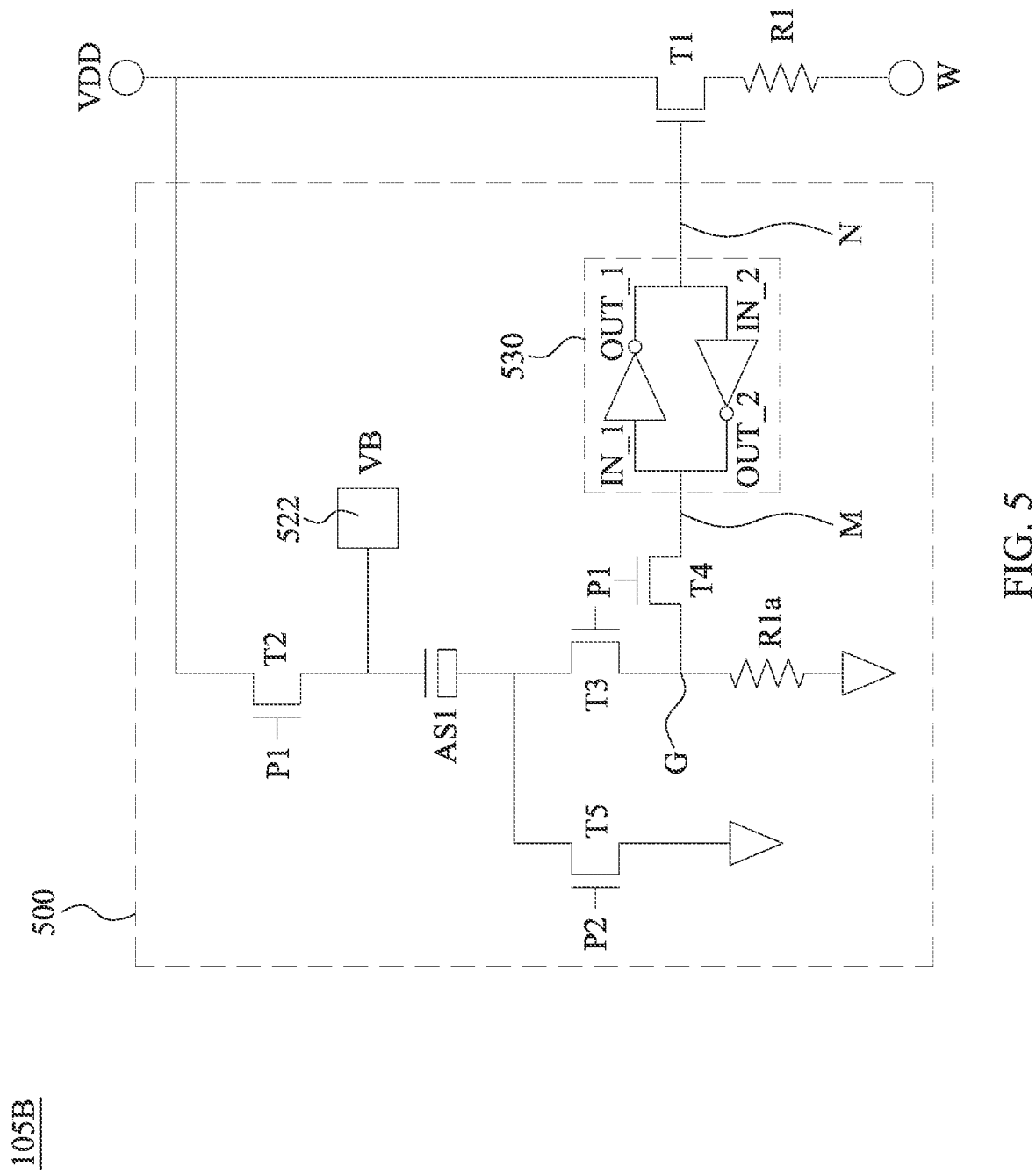
FIG. 5 is a block diagram of a configurable reference resistor unit, in accordance with some embodiments of the present disclosure.

FIG. 5 is a block diagram of a configurable reference resistor unit 105B, in accordance with some embodiments of the present disclosure. In some embodiments, the elements shown in FIG. 5 are similar to those of FIG. 3, but in a different arrangement. Accordingly, detailed descriptions of those elements in paragraphs associated with FIG. 3 can be applicable to those elements in FIG. 5, such as the OTP element AS1.

As shown in FIG. 5, the configurable reference resistor unit 105B may include a resistor R1, a transistor T1, and a configurable unit 500. The configurable unit 500 is configured to generate a configurable signal N to be provided to the transistor T1. In some embodiments, the configurable unit 500 may include an OTP element AS1, a resistor R1a, four transistors T2, T3, T4, and T5, a latch circuit 530, and a conductive contact 522. In some embodiments, the latch circuit 530 can include two inverters.

In some embodiments, the resistor R1 is configured to receive the power signal VDD. The transistor T1 is connected to the resistor R1. For example, the transistor T1 may be connected in series with the resistor R1. In some embodiments, the transistor T1 is configured to receive the power signal VDD. The transistor T1 has a gate connected to the configurable unit 500. In some embodiments, the gate of the transistor T1 may be configured to receive the configurable signal N generated by the configurable unit 500. In response to the configurable signal N, the transistor T1 can be turned on or off.

In some embodiments, the resistance of the resistors R1 and R2 may be kilo-a level. In some embodiments, the resistance of the resistors R1 and R2 can each be 100 kΩ, 200 kΩ, 300 kΩ, 400 kΩ, 500 kΩ, 800 kΩ, 1 MΩ, 1.5 MΩ, 2 MΩ, 3 MΩ, 4 MΩ, 5 MΩ, 6 MΩ, 7 MΩ, 8 MΩ, or even greater. The resistance of the resistor R1 can be determined according to needs. The resistance of the configurable reference resistor unit 105B would be identical to that of the resistor R1, when the transistor T1 is turned on. When the transistor T1 is turned off, the resistance of the configurable reference resistor unit 105B would be substantially zero Ω.

As shown in FIG. 5, the configurable unit 500 includes an OTP element AS1, a resistor R1a, four transistors T2, T3, T4, and T5, and a latch circuit 530. The OTP element AS1 can be configured to receive the power signal VDD. The OTP element AS1 can be connected to the reference resistor R1a. In some embodiments, the reference resistor R1a can be connected in series with the OTP element AS1. The OTP element AS1 can be configured to receive the power signal VDD through the transistor T2. The transistor T2 has a gate configured to receive a control signal P1. In some embodiments, the transistor T3 is coupled between the OTP element AS1 and the reference resistor R1a. The transistor T3 has a gate configured to receive the control signal P1.

In response to the control signal P1, the transistors T2 and T3 can be turned on to generate a signal M at a node G between the OTP element AS1 and the reference resistor R1a. In some embodiments, the transistors T2 and T3 can be turned on to establish a conductive path (not shown) passing through the OTP element AS1 and the reference resistor R1a to ground in response to the power signal VDD.

In some embodiments, the signal M is generated at a node G between the OTP element AS1 and the reference resistor R1a, in response to the power signal VDD. Referring to FIG. 5, the signal M generated at the node G can be transmitted to the latch circuit 530, through the transistor T4.

In some embodiments, the latch circuit 530 is configured to read the signal M generated at the node G between the OTP element AS1 and the reference resistor R1a. The node G is between the OTP element AS1 and the reference resistor R1a with or without other elements coupled therebetween. For example, the node G may be between the transistors T3 and T4. In one embodiment, the node G may be between the transistor T3 and the OTP element AS1.

The transistor T4 is coupled between the reference resistor R1a and the latch circuit 530. The transistor T4 has a gate configured to receive the control signal P1. In some embodiments, the transistor T4 is configured to be turned on to transmit the signal M to the latch circuit 530. When the transistors T2, T3, and T4 are configured to be turned on to establish the conductive path passing through the OTP element AS1 and reference resistor R1a, the signal M can be obtained at the node G and transmit to the latch circuit 530. In some embodiments, the latch circuit 530 can transform the signal M into a configurable signal N. In some embodiments, the latch circuit 530 is similar to the latch circuit 330 in FIG. 3, and thus detailed description thereof is omitted.

The configurable signal N (or signal M) is associated with the status of the OTP element AS1 (i.e., whether the OTP element AS1 is programmed). The configurable signal N (or signal M) can be output to the gate of the transistor T1, such that the transistor T1 can be turned on or off.

Referring to FIG. 5, the OTP element AS1 can be coupled to the conductive contact 522 to receive a status-setting signal VB. The status-setting signal VB in FIG. 5 can be similar to the status-setting signal VB in FIG. 2. In some embodiments, the status-setting signal VB may have a voltage capable of programming (blowing) the OTP element AS1. In some embodiments, the transistor T5 can be coupled between the OTP element AS1 and the ground. The transistor T5 has a gate configured to receive a control signal P2.

In some embodiments, in response to the control signal P2, the transistor T5 is configured to be turned on, such that the status-setting signal VB may be applied to the OTP element AS1. With the status-setting signal VB applied to the OTP element AS1, a status of the OTP element AS1 can be changed. In some embodiments, the OTP element AS1 can be programmed by the status-setting signal VB.

Similarly, the number of the resistors included in the configurable reference resistor unit 105B may be more. As more resistors are included in the configurable reference resistor unit 105B, flexibility of the variable resistance increases. In some embodiments, the number of the configurable units in the configurable reference resistor unit 105B may be more. In some embodiments, the number of the configurable units may correspond to the number of the resistors.

Figure 6:
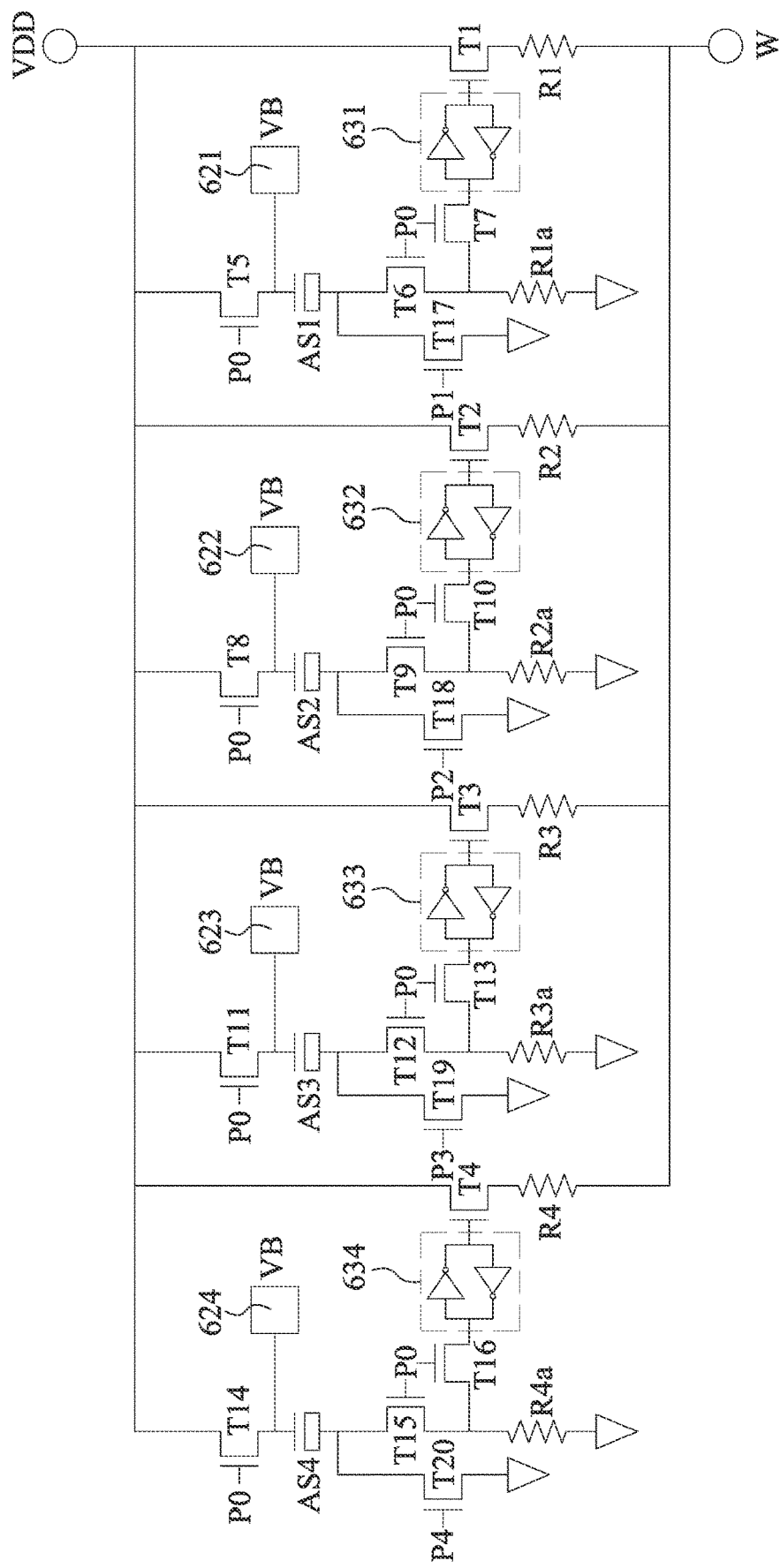
FIG. 6 is a block diagram of a configurable reference resistor unit, in accordance with some embodiments of the present disclosure.

FIG. 6 is a block diagram of a configurable reference resistor unit 605, in accordance with some embodiments of the present disclosure. The configurable reference resistor unit 605 in FIG. 6 is similar to the configurable reference resistor unit 105B in FIG. 5, differing in that in FIG. 6, the configurable reference resistor unit 605 includes more resistors and OTP elements for better flexibility.

As shown in FIG. 6, the configurable reference resistor unit 605 may include resistors R1, R2, R3 and R4, OTP elements AS1, AS2, AS3 and AS4, reference resistors R1a, R2a, R3a, and R4a, transistors T1, T2, T3, T4, T5, T6, T7, T8, T9, T10, T11, T12, T13, T14, T15, T16, T17, T18, T19, and T20, latch circuits 631, 632, 633, and 634, and conductive contacts 621, 622, 623, and 624.

In some embodiments, the resistor R1 is configured to receive the power signal VDD. The resistor R1 can be connected to the transistor T1. For example, the resistor R1 may be connected in series with the transistor T1. In some embodiments, the transistor T1 is configured to receive the power signal VDD. The resistor R1 can be connected to the resistor R2. In some embodiments, the resistor R1 can be connected in parallel with the resistor R2. In some embodiments, the resistor R1 can be connected to the node W.

In some embodiments, the resistor R2 is configured to receive the power signal VDD. The resistor R2 can be connected to the transistor T2. For example, the resistor R2 may be connected in series with the transistor T2. In some embodiments, the transistor T2 is configured to receive the power signal VDD. The resistor R2 can be connected to the resistor R3. In some embodiments, the resistor R2 can be connected in parallel with the resistor R3. In some embodiments, the resistor R2 can be connected to the node W.

In some embodiments, the resistor R3 is configured to receive the power signal VDD. The resistor R3 can be connected to the transistor T3. For example, the resistor R3 may be connected in series with the transistor T3. In some embodiments, the transistor T3 is configured to receive the power signal VDD. The resistor R3 can be connected to the resistor R4. In some embodiments, the resistor R3 can be connected in parallel with the resistor R4. In some embodiments, the resistor R3 can be connected to the node W.

In some embodiments, the resistor R4 is configured to receive the power signal VDD. The resistor R4 can be connected to the transistor T4. For example, the resistor R4 may be connected in series with the transistor T4. In some embodiments, the resistor R4 can be connected to the node W. In some embodiments, the resistors R1, R2, R3, and R4 can be connected to the node W. In other words, the resistors R1, R2, R3, and R4 are connected in parallel.

The resistors R1, R2, R3, and R4 may have the same resistance. In some embodiments, the resistors R1, R2, R3, and R4 may have different resistances. For example, the resistance of the resistor R1 can exceed the resistor R2. The resistance of the resistor R1 can fall below the resistor R2. In some embodiments, the resistance of the resistors R1, R2, R3, and R4 can each be 100 kΩ, 200 kΩ, 300 kΩ, 400 kΩ, 500 kΩ, 800 kΩ, 1 MΩ, 1.5 MΩ, 2 MΩ, 3 MΩ, 4 MΩ, 5 MΩ, 6 MΩ, 7 MΩ, 8 MΩ, or even greater. The resistance of the resistors R1, R2, R3, and R4 can be selected according to design need.

Referring to FIG. 6, the configurable reference resistor unit 605 includes four configurable unit (similar as the configurable unit 500 in FIG. 5) corresponding to the transistors T1, T2, T3, and T4, respectively. Wherein each gate of the transistors T1, T2, T3, and T4 can receive a respective configurable signal generated by the corresponding configurable unit (not labeled in FIG. 6).

The configurable reference resistor unit 605 can include the OTP element AS1 configured to receive the power signal VDD. The OTP element AS1 can be connected to the reference resistor R1a. For example, the reference resistor R1a can be connected in series with the OTP element AS1. The OTP element AS1 can be configured to receive the power signal VDD through the transistor T5. The transistor T5 has a gate configured to receive a control signal P0. In some embodiments, the transistor T6 is coupled between the OTP element AS1 and the reference resistor R1a. The transistor T6 has a gate configured to receive the control signal P0.

As shown in FIG. 6, the latch circuit 631 is coupled to the OTP element AS1. The latch circuit 631 may be coupled to the OTP element AS1 through the transistor T7. That is, the transistor T7 can be connected between the OTP element AS1 and the latch circuit 631. The transistor T7 has a gate configured to receive the control signal P0. In some embodiments, the transistor T7 is configured to be turned on to transmit the signal, obtained between the OTP element AS1 and the reference resistor R1a, to the latch circuit 631.

In some embodiments, the latch circuit 631 can output a configurable signal to the gate of the transistor T1 based on the signal obtained between the OTP element AS1 and the reference resistor R1a. In other words, the configurable signal is associated with the status of the OTP element AS1. The OTP element AS1 is similar to the OTP element AS1 in FIG. 3, and thus detailed description thereof is omitted. In response to the configurable signal generated by the latch circuit 631, the transistor T1 can be turned on.

The configurable reference resistor unit 605 can include the OTP element AS2 configured to receive the power signal VDD. The OTP element AS2 can be connected to the reference resistor R2a. For example, the reference resistor R2a can be connected in series with the OTP element AS2.

The OTP element AS2 can be configured to receive the power signal VDD through the transistor T8. The transistor T8 has a gate configured to receive a control signal P0. In some embodiments, the transistor T9 is coupled between the OTP element AS2 and the reference resistor R2a. The transistor T9 has a gate configured to receive the control signal P0.

As shown in FIG. 6, the latch circuit 632 is coupled to the OTP element AS2. The latch circuit 632 may be coupled to the OTP element AS2 through the transistor T10. That is, the transistor T10 can be connected between the OTP element AS2 and the latch circuit 632. The transistor T10 has a gate configured to receive the control signal P0. In some embodiments, the transistor T10 is configured to be turned on to transmit the signal, obtained between the OTP element AS2 and the reference resistor R2a, to the latch circuit 632.

In some embodiments, the latch circuit 632 can output a configurable signal to the gate of the transistor T2 based on the signal obtained between the OTP element AS2 and the reference resistor R2a. In other words, the configurable signal is associated with the status of the OTP element AS2. The OTP element AS2 is similar to the OTP element AS2 in FIG. 3, and thus detailed description thereof is omitted. In response to the configurable signal generated by the latch circuit 632, the transistor T2 can be turned on.

The configurable reference resistor unit 605 can include the OTP element AS3 configured to receive the power signal VDD. The OTP element AS3 can be connected to the reference resistor R3a. For example, the reference resistor R3a can be connected in series with the OTP element AS3. The OTP element AS3 can be configured to receive the power signal VDD through the transistor T11. The transistor T11 has a gate configured to receive a control signal P0. In some embodiments, the transistor T12 is coupled between the OTP element AS3 and the reference resistor R3a. The transistor T12 has a gate configured to receive the control signal P0.

As shown in FIG. 6, the latch circuit 633 is coupled to the OTP element AS3. The latch circuit 633 may be coupled to the OTP element AS3 through the transistor T13. That is, the transistor T13 can be connected between the OTP element AS3 and the latch circuit 633. The transistor T13 has a gate configured to receive the control signal P0. In some embodiments, the transistor T13 is configured to be turned on to transmit the signal, obtained between the OTP element AS3 and the reference resistor R3a, to the latch circuit 633.

In some embodiments, the latch circuit 633 can output a configurable signal to the gate of the transistor T3 based on the signal obtained between the OTP element AS3 and the reference resistor R3a. In other words, the configurable signal is associated with the status of the OTP element AS3. The OTP element AS3 is similar to the OTP element AS3 in FIG. 3, and thus detailed description thereof is omitted. In response to the configurable signal generated by the latch circuit 633, the transistor T3 can be turned on.

The configurable reference resistor unit 605 can include the OTP element AS4 configured to receive the power signal VDD. The OTP element AS4 can be connected to the reference resistor R4a. For example, the reference resistor R4a can be connected in series with the OTP element AS4. The OTP element AS4 can be configured to receive the power signal VDD through the transistor T14. The transistor T14 has a gate configured to receive a control signal P0. In some embodiments, the transistor T15 is coupled between the OTP element AS4 and the reference resistor R4a. The transistor T15 has a gate configured to receive the control signal P0.

As shown in FIG. 6, the latch circuit 634 is coupled to the OTP element AS4. The latch circuit 634 may be coupled to the OTP element AS4 through the transistor T16. That is, the transistor T16 can be connected between the OTP element AS4 and the latch circuit 634. The transistor T16 has a gate configured to receive the control signal P0. In some embodiments, the transistor T16 is configured to be turned on to transmit the signal, obtained between the OTP element AS4 and the reference resistor R4a, to the latch circuit 634.

In some embodiments, the latch circuit 634 can output a configurable signal to the gate of the transistor T4 based on the signal obtained between the OTP element AS4 and the reference resistor R4a. In other words, the configurable signal is associated with the status of the OTP element AS4. The OTP element AS4 is similar to the OTP element AS4 in FIG. 3, and thus detailed description thereof is omitted. In response to the configurable signal generated by the latch circuit 634, the transistor T4 can be turned on.

In some embodiments, the OTP elements AS1, AS2, AS3 and AS4 are similar to the OTP element AS1 in FIG. 5, and thus detailed description thereof is omitted.

In some embodiments, in response to the control signal P0, the transistors T5, T6, T7, T8, T9, T10, T11, T12, T13, T14, T15, and T16 can be turned on to generate the signal X at the node W. In some embodiments, a resistance of the configurable reference resistor unit 605 is associated with a status of the OTP elements AS1, AS2, AS3, and AS4. By programming one or more of the OTP elements AS1, AS2, AS3, and AS4, the total resistance of the configurable reference resistor unit 605 can be adjusted.

Referring to FIG. 6, the OTP element AS1 can be coupled to the conductive contact 621 to receive a status-setting signal VB. The status-setting signal VB in FIG. 6 can be the same as the status-setting signal VB in FIG. 5. In some embodiments, the transistor T17 can be coupled between the OTP element AS1 and the ground. The transistor T17 has a gate configured to receive a control signal P1. In response to the control signal P1, the transistor T17 is configured to be turned on, such that the status-setting signal VB can be applied to the OTP element AS1. With the status-setting signal VB applied to the OTP element AS1, a status of the OTP element AS1 may be changed. In other words, the OTP element AS1 can be programmed by the status-setting signal VB.

In some embodiments, the OTP element AS2 can be coupled to the conductive contact 622 to receive a status-setting signal VB. The status-setting signal VB in FIG. 6 can be the same as the status-setting signal VB in FIG. 5. In some embodiments, the transistor T18 can be coupled between the OTP element AS2 and the ground. The transistor T18 has a gate configured to receive a control signal P2. In response to the control signal P2, the transistor T18 is configured to be turned on, such that the status-setting signal VB may be applied to the OTP element AS2. With the status-setting signal VB applied to the OTP element AS2, a status of the OTP element AS2 may be changed. In other words, the OTP element AS2 can be programmed under the status-setting signal VB.

In some embodiments, the OTP element AS3 can be coupled to the conductive contact 623 to receive a status-setting signal VB. The status-setting signal VB in FIG. 6 can be the same as the status-setting signal VB in FIG. 5. In some embodiments, the transistor T19 can be coupled between the OTP element AS3 and the ground. The transistor T19 has a gate configured to receive a control signal P3. In response to the control signal P3, the transistor T19 is configured to be turned on, such that the status-setting signal VB may be applied to the OTP element AS3. With the status-setting signal VB applied to the OTP element AS3, a status of the OTP element AS3 may be changed. In other words, the OTP element AS3 can be programmed under the status-setting signal VB.

In some embodiments, the OTP element AS4 can be coupled to the conductive contact 624 to receive a status-setting signal VB. The status-setting signal VB in FIG. 6 can be the same as the status-setting signal VB in FIG. 5. In some embodiments, the transistor T20 can be coupled between the OTP element AS4 and the ground. The transistor T20 has a gate configured to receive a control signal P4. In response to the control signal P4, the transistor T20 is configured to be turned on, such that the status-setting signal VB may be applied to the OTP element AS4. With the status-setting signal VB applied to the OTP element AS4, a status of the OTP element AS4 may be changed. In other words, the OTP element AS4 can be programmed under the status-setting signal VB.

According to need, the resistance of the configurable reference resistor unit 605 can be adjusted by programming one or more of the OTP elements AS1, AS2, AS3, and AS4. In some embodiments, the configurable reference resistor unit 605 includes fifteen different configurations, each providing a different overall resistance. Detailed configuration of the configurable reference resistor unit 605 is provided in Table 2 as follows. Columns AS1, AS2, AS3 and AS4 show the status of corresponding OTP element, wherein "0" represents an unprogrammed status, and "1" represents a programmed status. The column Total Resistance shows the total resistance of the configurable reference resistor unit 605 under each configuration.

TABLE 2

| Configuration | PS1 | PS2 | PS3 | PS4 | Total resistance |
|---|---|---|---|---|---|
| 1 | 0 | 0 | 0 | 0 | 1/(1/R1 + 1/R2 + 1/R3 + 1/R4) |
| 2 | 1 | 0 | 0 | 0 | 1/(1/R2 + 1/R3 + 1/R4) |
| 3 | 0 | 1 | 0 | 0 | 1/(1/R1 + 1/R3 + 1/R4) |
| 4 | 0 | 0 | 1 | 0 | 1/(1/R1 + 1/R2 + 1/R4) |
| 5 | 0 | 0 | 0 | 1 | 1/(1/R1 + 1/R2 + 1/R3) |
| 6 | 1 | 1 | 0 | 0 | 1/(1/R3 + 1/R4) |
| 7 | 1 | 0 | 1 | 0 | 1/(1/R2 + 1/R4) |
| 8 | 1 | 0 | 0 | 1 | 1/(1/R2 + 1/R3) |
| 9 | 0 | 1 | 1 | 0 | 1/(1/R1 + 1/R4) |
| 10 | 0 | 1 | 0 | 1 | 1/(1/R1 + 1/R3) |
| 11 | 0 | 0 | 1 | 1 | 1/(1/R1 + 1/R2) |
| 12 | 1 | 1 | 1 | 0 | R4 |
| 13 | 1 | 1 | 0 | 1 | R3 |
| 14 | 1 | 0 | 1 | 1 | R2 |
| 15 | 0 | 1 | 1 | 1 | R1 |
| 16 | 1 | 1 | 1 | 1 | ∞ |

In some embodiments, the resistor R1 can be 1 MΩ, the resistor R2 can be 2 MΩ, the resistor R3 can be 4 MΩ, and the resistor R4 can be 8 MΩ. Accordingly, the total resistance may be variable in a range of 0.375 to 8 MΩ. Since Configuration 16 has a total resistance of an infinite value, it is generally not applicable in normal conditions. Accordingly, the total resistance may be variable in a range of 0.533 to 8 MΩ. Furthermore, the total resistance of each configuration in this example is provided in Table 2A as follows.

TABLE 2A

| Configuration | AS1 | AS2 | AS3 | AS4 | Total resistance (MΩ) |
|---|---|---|---|---|---|
| 1 | 0 | 0 | 0 | 0 | 0.533 |
| 2 | 1 | 0 | 0 | 0 | 1.143 |
| 3 | 0 | 1 | 0 | 0 | 0.727 |
| 4 | 0 | 0 | 1 | 0 | 0.615 |
| 5 | 0 | 0 | 0 | 1 | 0.571 |
| 6 | 1 | 1 | 0 | 0 | 2.667 |
| 7 | 1 | 0 | 1 | 0 | 1.6 |
| 8 | 1 | 0 | 0 | 1 | 1.333 |
| 9 | 0 | 1 | 1 | 0 | 0.889 |
| 10 | 0 | 1 | 0 | 1 | 0.8 |
| 11 | 0 | 0 | 1 | 1 | 0.667 |
| 12 | 1 | 1 | 1 | 0 | 8 |
| 13 | 1 | 1 | 0 | 1 | 4 |
| 14 | 1 | 0 | 1 | 1 | 2 |
| 15 | 0 | 1 | 1 | 1 | 1 |
| 16 | 1 | 1 | 1 | 1 | ∞ |

As shown in FIG. 6, OTP elements AS1, AS2, AS3, and AS4 are unblown. FIG. 6 illustrates Configuration 1 listed in Table 2 and Table 2A. That is, the total resistance of the configurable reference resistor 605 can be regarded as the parallel equivalent resistance of the resistors R1, R2, R3, and R4. According to the embodiment of Table 2A, the total resistance of the configurable reference resistor 605 can be about 0.533 MΩ.

Figure 6A:
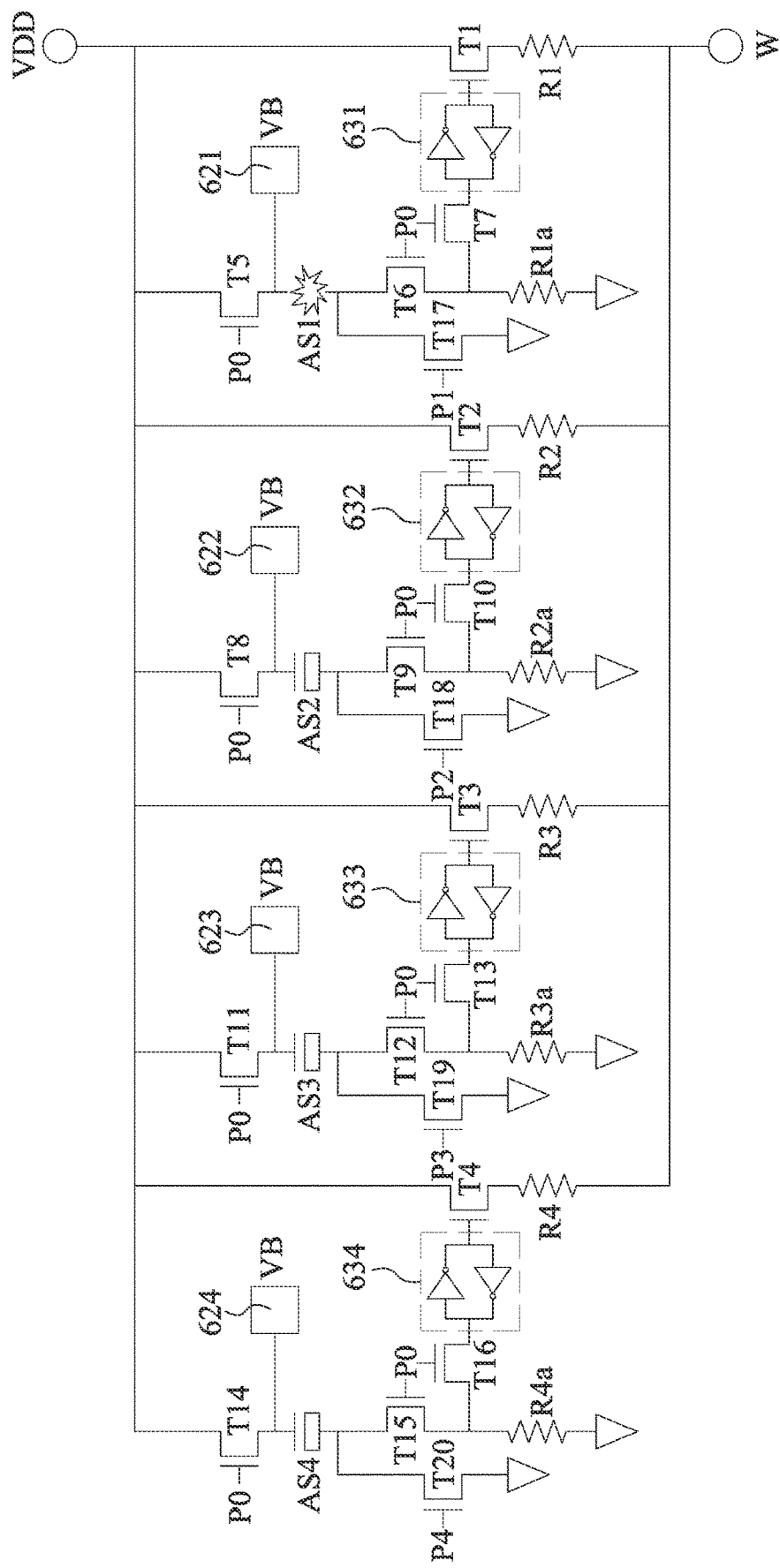
FIG. 6A illustrates an exemplary configuration of the configurable reference resistor unit, in accordance with some embodiments of the present disclosure.

FIG. 6A illustrates an exemplary configuration of the configurable reference resistor unit 605a, in accordance with some embodiments of the present disclosure. The configurable reference resistor unit 605a in FIG. 6A is similar to the configurable reference resistor unit 605 in FIG. 6, differing in that in FIG. 6A, the configurable reference resistor unit 605a includes the OTP element AS1 being programmed.

As the OTP element AS1 are programmed, FIG. 6A represents Configuration 1 listed in Table 2 and Table 2A. That is, in this embodiment, the total resistance of the configurable reference resistor 605a can be regarded as the parallel equivalent resistance of the resistors R2, R3, and R4. According to the embodiment of Table 2A, the total resistance of the configurable reference resistor 605a can be 1.143 MΩ.

Figure 7:
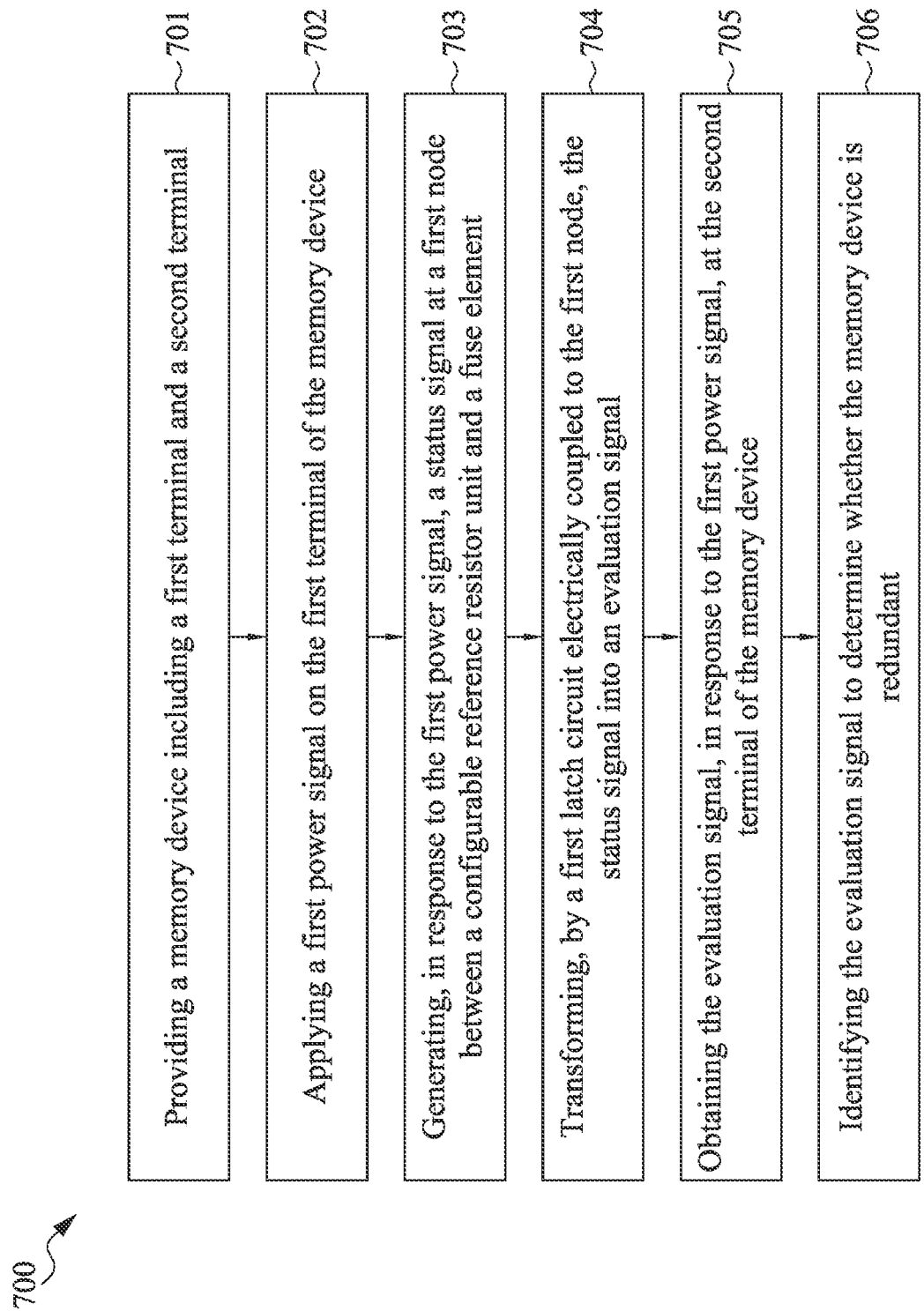
FIG. 7 is a flowchart of a method for determining status of a fuse element, in accordance with some embodiments of the present disclosure.

FIG. 7 is a flowchart of a method 700 for determining status of a fuse element, in accordance with some embodiments of the present disclosure. The method 700 can be utilized, for example, to determine a status of the fuse element 101 of FIG. 2. The method 700 for determining status of a fuse element 101 in a memory device may include operations 701, 702, 703, 704, 705, and 706. In some embodiments, the method 700 may be operated by a system as shown in FIG. 1.

For better understanding, the method 700 may be described referring the semiconductor device (memory device) 100 shown in FIG. 2. In operation 701, a memory device including an input terminal and an output terminal may be provided. In some embodiments, the memory device can include one or more memory cells or memory bits.

In operation 702, a power signal VDD can be applied to the input terminal of the memory device. In some embodiments, the memory device may include a configurable reference resistor unit 105 and a fuse element 101. The configurable reference resistor unit 105 can be electrically coupled to the fuse element 101.

In operation 703, in response to the power signal, a signal X can be generated at a node W between the configurable reference resistor unit 105 and the fuse element 101. In some embodiments, the resistance of the configurable reference resistor unit 105 may exceed the resistance of the fuse element 101. In another embodiments, the configurable reference resistor unit 105 may have a lower resistance than fuse element 101.

In operation 704, the signal X can be transformed by a latch circuit 130 into a signal Y. In some embodiments, the latch circuit 130 can be electrically coupled to the node W. In some embodiments, the process of transforming signal may include inverting or phase shifting signal. In other words, the signal X can be inverted into the signal Y. The signal X can be phase shifted to become the signal Y. In some embodiments, the signal X may be compared with a predetermined signal. Accordingly, in response to the result of comparison, the signal Y can be generated. In some embodiments, the operation of the comparison can be conducted by the latch circuit. In some embodiments, the operation of the comparison can be conducted by an external system coupled to the memory device.

In some embodiments, based on the comparison of the signal X and the predetermined signal, the logic signal Y can be output at the output terminal of the memory device. When the signal X exceeds the predetermined signal, it indicates that the fuse element is not blown. On the contrary, when the signal X fails to exceed the predetermined signal, it indicates that the fuse element 101 is blown.

In some embodiments, with the signal X exceeding the predetermined signal, the latch circuit 130 can output a logic high signal Y. In contrast, when the signal X is lower than the predetermined signal, the latch circuit 130 may output a logic low signal Y.

In operation 705, the evaluation signal Y can be obtained at the output terminal of the memory device.

In operation 706, the signal Y is identified to determine whether the memory device is redundant. In some embodiments, the status of the fuse element 101 can be utilized to determine whether the semiconductor device is a redundant device or a normal device. In some embodiments, the operation of identifying the signal Y may be conducted by an external system of the memory device. In some embodiments, as the logic high signal Y is identified, it indicates that the fuse element 101 is blown, and logic low signal Y indicates that the fuse element 101 is unblown.

With the signal identified, the status of the fuse element can be determined. Accordingly, the memory status (normal or redundant) can be determined. With improved status identification, memory issues can be easily solved.

One aspect of the present disclosure provides a semiconductor circuit for determining status of a fuse element of a memory device. The semiconductor circuit includes a configurable reference resistor unit having a first terminal configured to receive a first power signal and a second terminal configured to electrically couple with the fuse element. In addition, the semiconductor circuit further includes a latch circuit for reading a first status signal of a first node between the configurable reference resistor unit and the fuse element. The configurable reference resistor unit includes a first resistor, a first transistor connected in parallel with the first resistor, and a first configurable unit connected to a gate of the first transistor. The first configurable unit is configured to generate a first configurable signal to be provided to the gate of the first transistor.

Another aspect of the present disclosure provides a semiconductor device for determining status of a fuse element of a memory device. The semiconductor device includes a configurable reference resistor unit having a first terminal configured to receive a first power signal and a second terminal configured to electrically couple with the fuse element. The configurable reference resistor unit includes a first resistor, a first transistor connected in series with the first resistor, and a first configurable unit connected to a gate of the first transistor. The first configurable unit is configured to generate a first configurable signal to be provided to the gate of the first transistor.

Another aspect of the present disclosure provides a method for determining status of a fuse element of a memory device. The method includes providing the memory device including a first terminal and a second terminal and applying a first power signal on the first terminal of the semiconductor device. The memory device includes a configurable reference resistor unit electrically coupled to the fuse element. The method also includes obtaining an evaluation signal at the second terminal of the memory device and identifying the evaluation signal to determine whether the memory device is redundant. The configurable reference resistor unit includes a first resistor, a first transistor connected in parallel with the first resistor, and a first configurable unit connected to a gate of the first transistor. The first configurable unit is configured to generate a first configurable signal to turn on the first transistor.

The configurable reference resistor unit has variable resistance. The variable resistance can satisfy different resistances in the fuse element, as caused by process variants. According to the actual resistance of the corresponding fuse element, the resistance of the configurable reference resistor can be modified after the device is manufactured. Therefore, the present disclosure provides increased flexibility. In addition, the configurable reference resistor unit is adjusted by programming the OTP element (for example, anti-fuse), which reduces impact on the adjacent area during programming With the device having the flexible resistor, no additional photomask for reference resistor is required, and thus, production time can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for determining status of a fuse element of a memory device, wherein memory device includes a configurable reference resistor unit electrically coupled to the fuse element, and the configurable reference resistor unit includes a first terminal and a second terminal, the method comprising:

applying a first power signal on the first terminal of the configurable reference resistor unit;

obtaining an evaluation signal, in response to the first power signal, at a first node between the second terminal of the configurable reference resistor unit and the fuse element; and identifying the evaluation signal to determine whether the memory device is redundant, wherein the configurable reference resistor unit includes:
- a first resistor, receiving the first power signal and connected to the first node;
- a first transistor connected in parallel with the first resistor and connected to the first node; and
- a first configurable unit connected to a gate of the first transistor, wherein the first configurable unit is configured to generate a first configurable signal to turn on the first transistor.

2. The method of claim 1, further comprising:

generating, in response to the first power signal, a status signal at the first node between the configurable reference resistor unit and the fuse element; and transforming, by a first latch circuit electrically coupled to the first node, the status signal into the evaluation signal.

3. The method of claim 2, wherein the transforming the status signal into the evaluation signal further comprises:

comparing the status signal and a predetermined signal; and outputting the evaluation signal based on the comparison between the status signal and the predetermined signal.

4. The method of claim 1, wherein the first configurable unit further comprises:
- a one-time programmable (OTP) element configured to receive a second power signal;
- a reference resistor connected in series with the OTP element; and
- a second latch circuit configured to read a first mode signal at a second node between the OTP element and the reference resistor, wherein the first mode signal is transformed, by the second latch circuit, into the first configurable signal.

5. The method of claim 4, wherein the OTP element includes an anti-fuse.

6. The method of claim 4, wherein a resistant value of the configurable reference resistor unit is associated with a status of the OTP element.

7. The method of claim 5, wherein the first configurable unit further comprises:
- a second transistor coupled to the OTP element, and having a gate configured to receive a first control signal; and
- a third transistor coupled between the OTP element and the reference resistor, and having a gate configured to receive the first control signal.

8. The method of claim 7, wherein in response to the second power signal being applied to the OTP element, the second transistor and the third transistor are configured to be turned on to generate the first mode signal at the second node between the OTP element and the reference resistor.

9. The method of claim 7, wherein the configurable unit further comprises:
- a fourth transistor coupled between the OTP element and the second latch circuit, wherein the fourth transistor is configured to transmit the first mode signal to the second latch circuit.

10. The method of claim 7, wherein the first configurable unit further comprises:
- a fifth transistor coupled between a second conductive contact and the OTP element, and having a gate configured to receive a second control signal, wherein the fifth transistor is configured to receive a third power signal from the second conductive contact; and
- a sixth transistor coupled between the OTP element and the ground, and having a gate configured to receive the second control signal, wherein, in response to the fifth transistor and the sixth transistor being turned on by the second control signal, the OTP element is programmed.

* * * * *